(12) United States Patent
Herner et al.

(10) Patent No.: US 11,404,431 B2
(45) Date of Patent: Aug. 2, 2022

(54) METHODS FOR FORMING MULTILAYER HORIZONTAL NOR-TYPE THIN-FILM MEMORY STRINGS

(71) Applicant: SUNRISE MEMORY CORPORATION, Fremont, CA (US)

(72) Inventors: Scott Brad Herner, Lafayette, CO (US); Wu-Yi Henry Chien, San Jose, CA (US); Jie Zhou, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 186 days.

(21) Appl. No.: 16/703,663

(22) Filed: Dec. 4, 2019

(65) Prior Publication Data

US 2020/0176468 A1 Jun. 4, 2020

Related U.S. Application Data

(60) Provisional application No. 62/775,310, filed on Dec. 4, 2018.

(51) Int. Cl.
*H01L 27/11582* (2017.01)
*H01L 29/66* (2006.01)
*H01L 21/308* (2006.01)

(52) U.S. Cl.
CPC ...... *H01L 27/11582* (2013.01); *H01L 21/308* (2013.01); *H01L 29/66833* (2013.01)

(58) Field of Classification Search
CPC ............ H01L 27/11582; H01L 21/308; H01L 29/66833
See application file for complete search history.

(56) References Cited

U.S. PATENT DOCUMENTS

| 7,553,770 B2 | 6/2009 | Kiehlbauch |
| 9,449,821 B2 | 9/2016 | Vang et al. |
| 2009/0267175 A1* | 10/2009 | Wallace ............ H01L 21/0271 257/E21.232 |
| 2014/0077126 A1 | 3/2014 | Benson et al. |
| 2015/0348848 A1* | 12/2015 | Fu ..................... H01L 29/42392 257/329 |
| 2017/0092371 A1 | 3/2017 | Harari |
| 2018/0174894 A1* | 6/2018 | Bouche ............. H01L 21/31144 |
| 2020/0035701 A1* | 1/2020 | Huang .............. H01L 27/11568 |
| 2021/0057535 A1* | 2/2021 | Chiang ............. H01L 29/66439 |

FOREIGN PATENT DOCUMENTS

CN   103579004 A  *  2/2014  .......... H01L 21/3065

* cited by examiner

*Primary Examiner* — Peter Bradford
(74) *Attorney, Agent, or Firm* — Edward C. Kwok; VLP Law Group, LLP

(57) ABSTRACT

Various methods overcome the limitations and achieve superior scaling by (i) replacing a single highly challenging high aspect ratio etch step with two or more etch steps of less challenging aspect ratios and which involve wider and more mechanically stable active strips, (ii) using dielectric pillars for support and to maintain structural stability during a high aspect ratio etch step and subsequent processing steps, or (iii) using multiple masking steps to provide two or more etch steps of less challenging aspect ratios and which involve wider and more mechanically stable active strips.

17 Claims, 51 Drawing Sheets

METHODS FOR FORMING MULTILAYER HORIZONTAL NOR-TYPE THIN-FILM MEMORY STRINGS

CROSS-REFERENCE TO RELATED APPLICATIONS

The present application relates to and claims priority of (i) U.S. provisional application ("Provisional application I"), Ser. No. 62/775,310, entitled "Methods for Forming Multilayer Horizontal NOR-type Thin-film Memory Strings," filed Dec. 4, 2018.

The present invention also relates to (i) U.S. provisional application ("Provisional application II"), Ser. No. 62/697,085, entitled "Fabrication Method for a 3-Dimensional NOR Memory Array," filed Jul. 12, 2018; (ii) U.S. provisional application ("Provisional application III"), Ser. No. 62/752,092, entitled "3-Dimensional NOR Memory Array with Very Fine Pitch: Device and Method," filed on Oct. 29, 2018; and (iii) U.S. provisional patent application ("Provisional application IV"), Ser. No. 62/771,922, entitled "Staircase Structures for Electrically Connecting Multiple Horizontal Conductive Layers of a 3-Dimensional Memory Device," filed on Nov. 27, 2018.

The present application is also related to U.S. non-provisional patent application ("Non-provisional application"), Ser. No. 16/012,731, entitled "3-Dimensional NOR Memory Array Architecture and Methods for Fabrication Thereof," filed on Jun. 19, 2018.

The disclosures of the Provisional applications I, II, III and IV, and Non-Provisional application are hereby incorporated by reference in their entireties.

BACKGROUND OF THE INVENTION

1. Field of the Invention

The present invention relates to forming 3-dimensional memory structures. In particular, the present invention relates to forming 3-dimensional memory structures for NOR-type thin-film memory strings above and substantially parallel to a planar surface of a semiconductor substrate.

2. Discussion of the Related Art

Methods for forming horizontal NOR-type ("HNOR") thin-film memory strings have been described previously. See, for example, the 3-dimensional horizontal NOR-type memory strings disclosed in the Provisional application II incorporated by reference above. In this detailed description, the term "active strip"[1] refers to a thin elongated strip of materials that include various layers of semiconductor and other materials that can facilitate or provide channel, source and drain regions for thin-film transistors to be formed along its length. These thin-film transistors may be organized as a NOR-type memory string by sharing a common source region and a common drain region. In some embodiments the common drain region serves as a bit line for the NOR-type memory string and the source region is electrically floating, except when accessed through one or more of the transistors in the NOR-type memory string. The collection of material layers in an active strip is referred to as an "active layer." The process flows described in Provisional application II teach forming stacks of active strips ("active stacks") by first depositing multiple active layers, followed by patterning and etching through the multiple active layers. The resulting active strips in each stack run parallel to each other and neighboring active stacks are separated from each other by deep trenches. The resulting active stacks can be organized into blocks, each representing a 3-dimensional array of horizontally arranged NOR-type memory strings ("HNOR memory array").

[1] In some cases, sometimes referred to as "NIN strips" or "bit line strips."

A process of Provisional application II achieves highly scaled and lower cost HNOR memory arrays by improving its ability to form narrower active strips and taller active stacks, which require carrying out increasingly challenging high aspect-ratio etching. To that end, Non-Provisional application teaches using braces or struts at appropriate intervals along the length of each active stack to enhance structural or mechanical stability. Structural instability may cause tilting, snaking, twisting, bowing, ribboning or shorting between adjacent active strips. These phenomena are aggravated by the taller stacks with greater number of active layers. The structural instability can be alleviated by segmenting each active strip into shorter active strips, placing more braces at shorter intervals, or forming wider active strips or lower stack heights. While these approaches all contribute to greater structural robustness, they require more silicon real estate per bit and therefore increasing the cost-per-bit.

SUMMARY

The methods according to a first embodiment of the present invention substantially overcome the limitations mentioned above—while achieving superior scaling—by replacing a single highly challenging high aspect ratio etch step with two or more etch steps of less challenging aspect ratios and which involve wider and more mechanically stable active strips.

The methods according to a second embodiment of the present invention uses dielectric pillars to support the memory structure and to maintain structural stability during a high aspect ratio etch step and subsequent processing steps.

The methods according to a third embodiment of the present invention uses multiple masking steps to provide two or more etch steps of less challenging aspect ratios and which involve wider and more mechanically stable active strips.

The present invention is better understood upon consideration of the detailed disclosure below, in conjunction with the accompanying drawings.

BRIEF DESCRIPTION OF THE DRAWINGS

To facilitate the detailed description below and cross-referencing of elements among the figures, like elements are assigned like reference numerals.

DETAILED DESCRIPTION OF THE PREFERRED EMBODIMENTS

The detailed description sets forth the process flows according to various embodiments of the present invention. At this time, while one or more embodiments may be preferred for reasons of manufacturability, other embodiments may be preferred for other reasons. As indicated in this detailed description, where appropriate, adoption of certain features in some embodiments may represent a trade-off based on such manufacturing considerations as preventing ribboning, structural instability or layer-to-layer misalignment. For example, embodiments according to FIGS. 1-24 avoid ribboning by forming the active stacks in multiple etch steps. By forming the active stacks in two or more etch steps, the aspect ratio required to be achieved by each etch is reduced, which also improves structural stability of the active strips to be formed. However, by etching the active stacks in two or more etch steps, the alignment between active strips not etched in the same step may suffer.

Figure 51A:
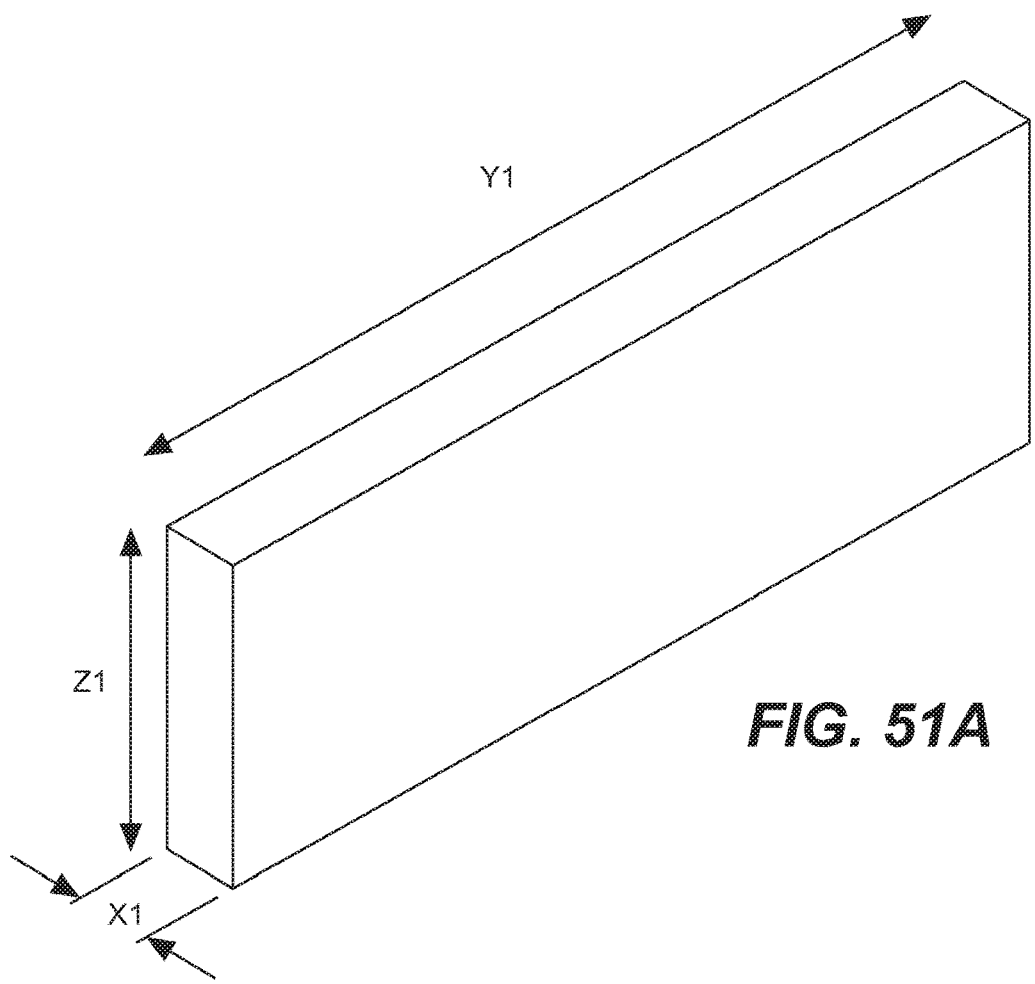
FIGS. 51A and 51B illustrate the phenomenon of ribboning.
Figure 51B:
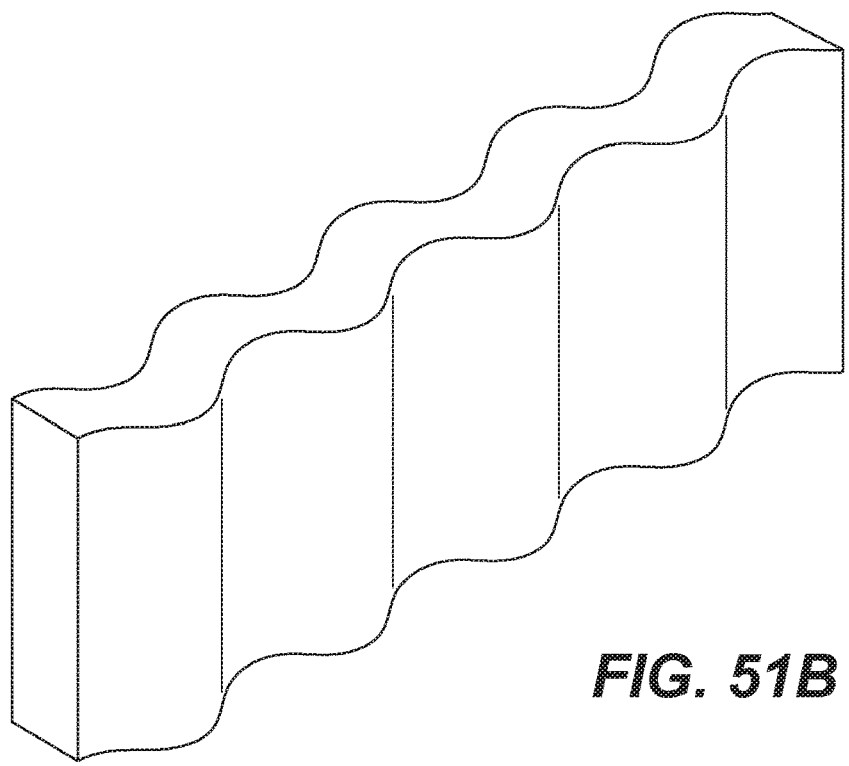

(FIGS. 51A and 51B illustrate the phenomenon of ribboning, which is a stress-induced deformation of a microscopic rectangular feature. FIG. 51A shows a microscopic rectangular feature (e.g., a feature formed out of developing a masking material) with intended dimensions width X1, length Y1 and height Z1. In some manufacturing processes, when the aspect ratio Z1/X1 exceeds 10, the stress in the rectangular feature may lead to deformation along length Y1, such that the resulting feature "ribbons" from an intended straight line to become a series of connected S-curves, such as shown in FIG. 51B. Ribboning is more acute with smaller widths, especially when width X1 is scaled below approximately 45 nm.)

In the detailed description below, unless the context dictates or unless specifically stated otherwise herein, different process steps discussed herein may be carried out in any order or simultaneously. Further, unless the context dictates or unless specifically stated otherwise herein one or more additional steps may be carried out before or after any process step discussed herein, or between any two process steps discussed herein. For example, although one of the embodiments is described with a step in which one or more metal layers are cladded with a protective semiconductor film barrier layer that is not described in conjunction with other embodiments, such a cladding step may also be used in conjunction with each of the other embodiments.

Figure 1:
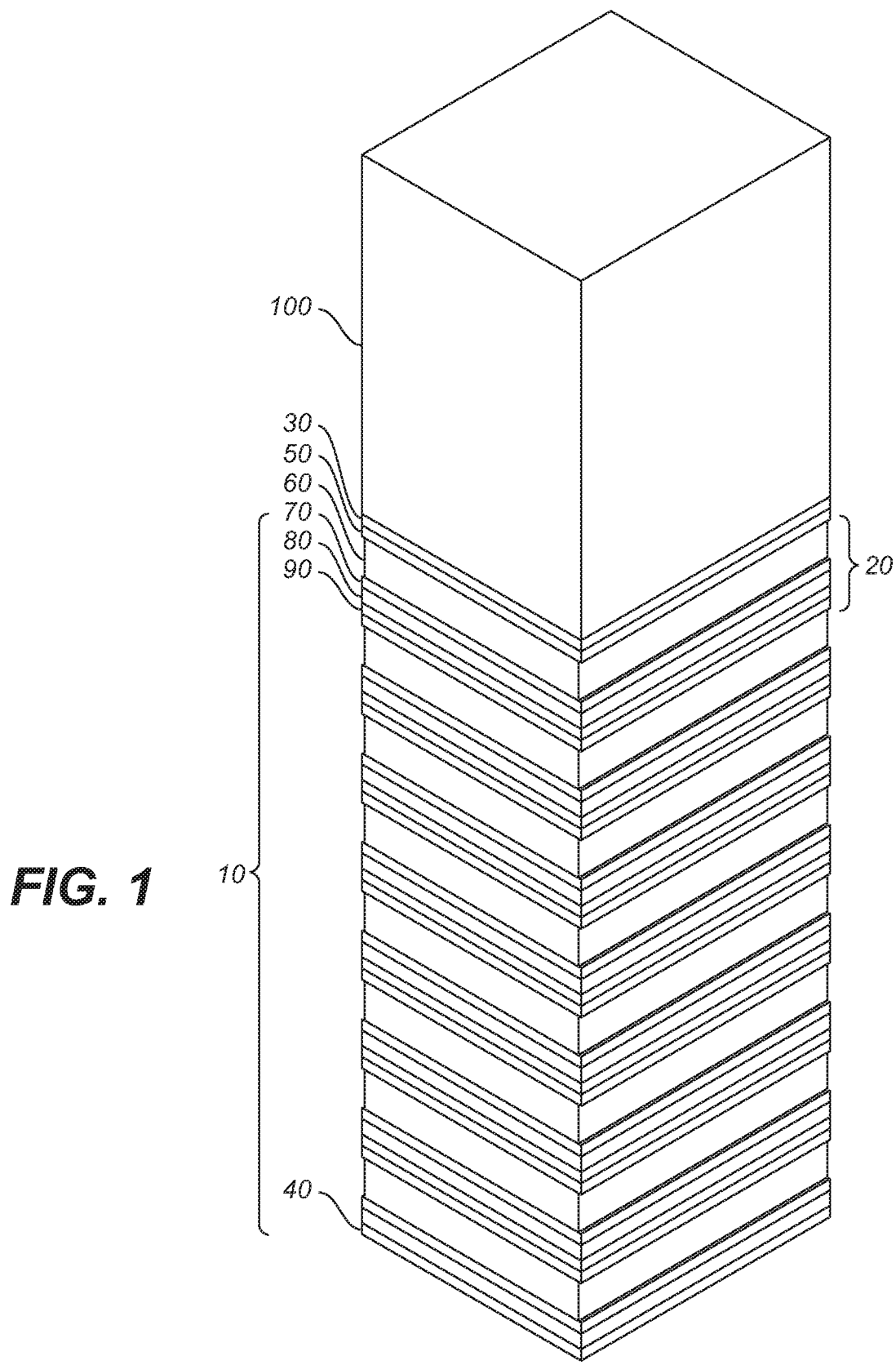
FIGS. 1, 2, 3, 4, 5, 6, 7, 8, 9, 10, 11, 12, 13, 14, 15, 16, 17, 18, 19, 20, 21, 22, 23 and 24 illustrate forming the active stacks of an HNOR memory array in two or more etching steps, according to a first embodiment of the present invention.

FIGS. 1-24 illustrate forming the active stacks of an HNOR memory array in two etching steps, according to a first embodiment of the present invention. As shown in FIG. 1, memory structure 10 includes eight successively deposited active layers (e.g., active layer 20) of different materials between hard mask layer 30 and etch-stop layer 40. (Although FIG. 1 shows eight active layers, that number of active layers are provided merely for illustrative purpose only. Any suitable number of active layers may be provided, such as one, two, four, six, sixteen, thirty-two, or more active layers. Each active layer (e.g., active layer 20) may include: (i) first semiconductor layer ("source layer") 50, (ii) first sacrificial layer ("SAC1") layer 60, (iii) second semiconductor layer ("drain layer") 70, (iv) second sacrificial layer ("SAC4") 80 and (v) interlayer dielectric layer ("ILD layer") 90. Source layer 50 and drain layer 70 may include any suitable semiconductor material (e.g., silicon, silicon germanium, doped to be n-type or p-type with one or more suitable dopant, such as boron or indium for p-type semiconductor, or arsenic, phosphorus, or antimony for n-type semiconductor). Hard mask layer 30, etch stop layer 40, SAC1 layer 60, SAC4 layer 80, and ILD layer 90 may include any suitable material, e.g., $SiO_2$, SiN, SiON, SiC, silicon germanium, or SiCOH. For example, in one implementation, SAC1 layer 60 may include $SiO_2$, SAC4 layer 80 may include SiN, and ILD layer 90 may be SiCOH. Each material layer in active layer 20 may be deposited using any suitable technique, such as low pressure chemical vapor deposition (LPCVD), plasma enhanced CVD (PECVD), atomic layer deposition (ALD, which is another form of CVD), sputtering, or evaporation, preferably by PECVD.

Figure 2:
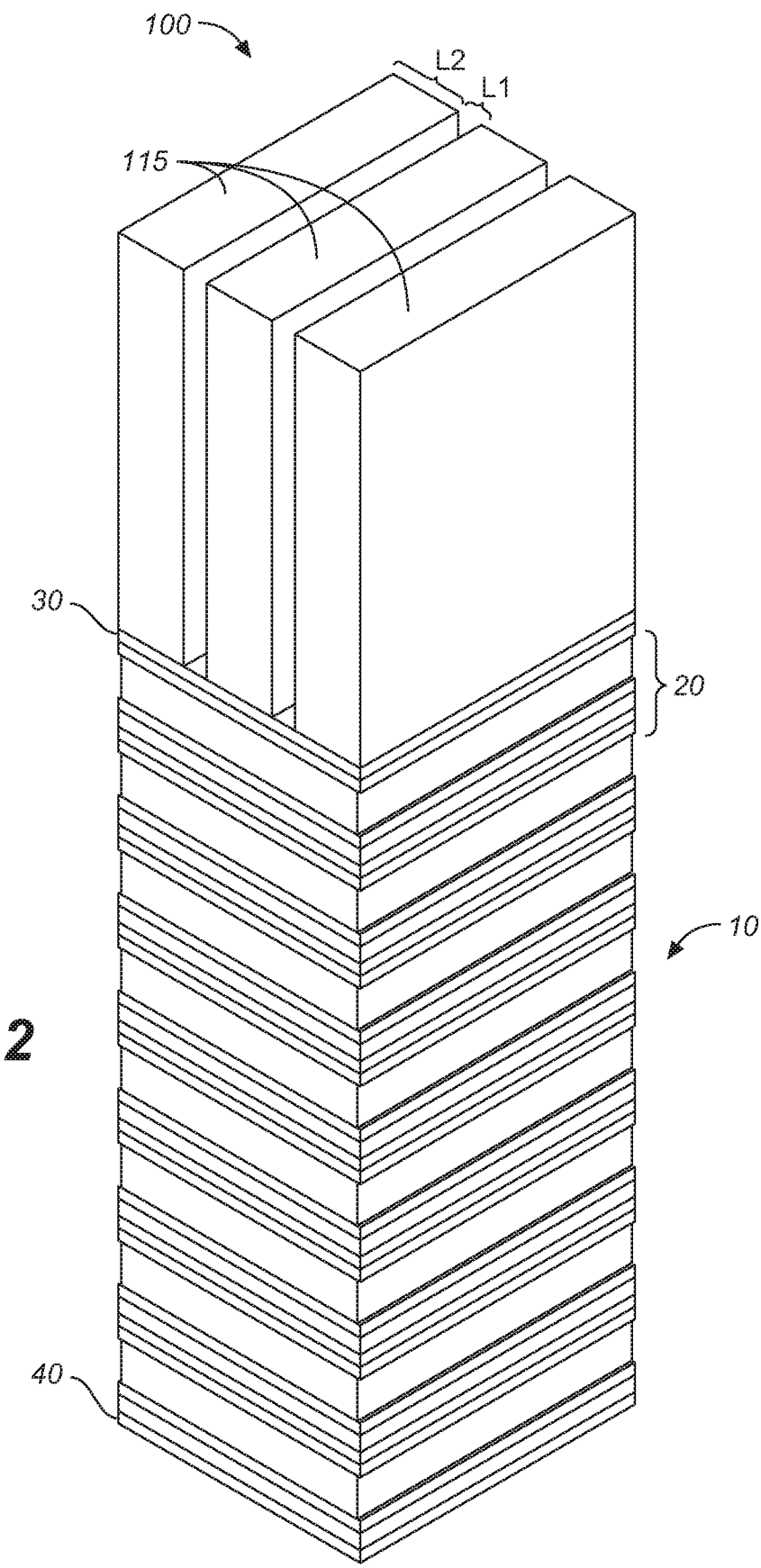

Masking layer 100 may be deposited on top of memory structure 10. Masking layer 100 may include, for example, both a carbon-based layer and a photoresist layer. FIG. 2 shows memory structure 10 of FIG. 1, after masking layer 100 is patterned. As shown in FIG. 2, masking layer 100 is patterned into masking structures 115, each having width $L_2$ and each separating from its neighbors by trenches of width $L_1$, with width $L_2$ preferably not less than twice desired width $L_1$. Width $L_1$ defines the desired width of the trenches between the active strips to be formed.

Figure 3:
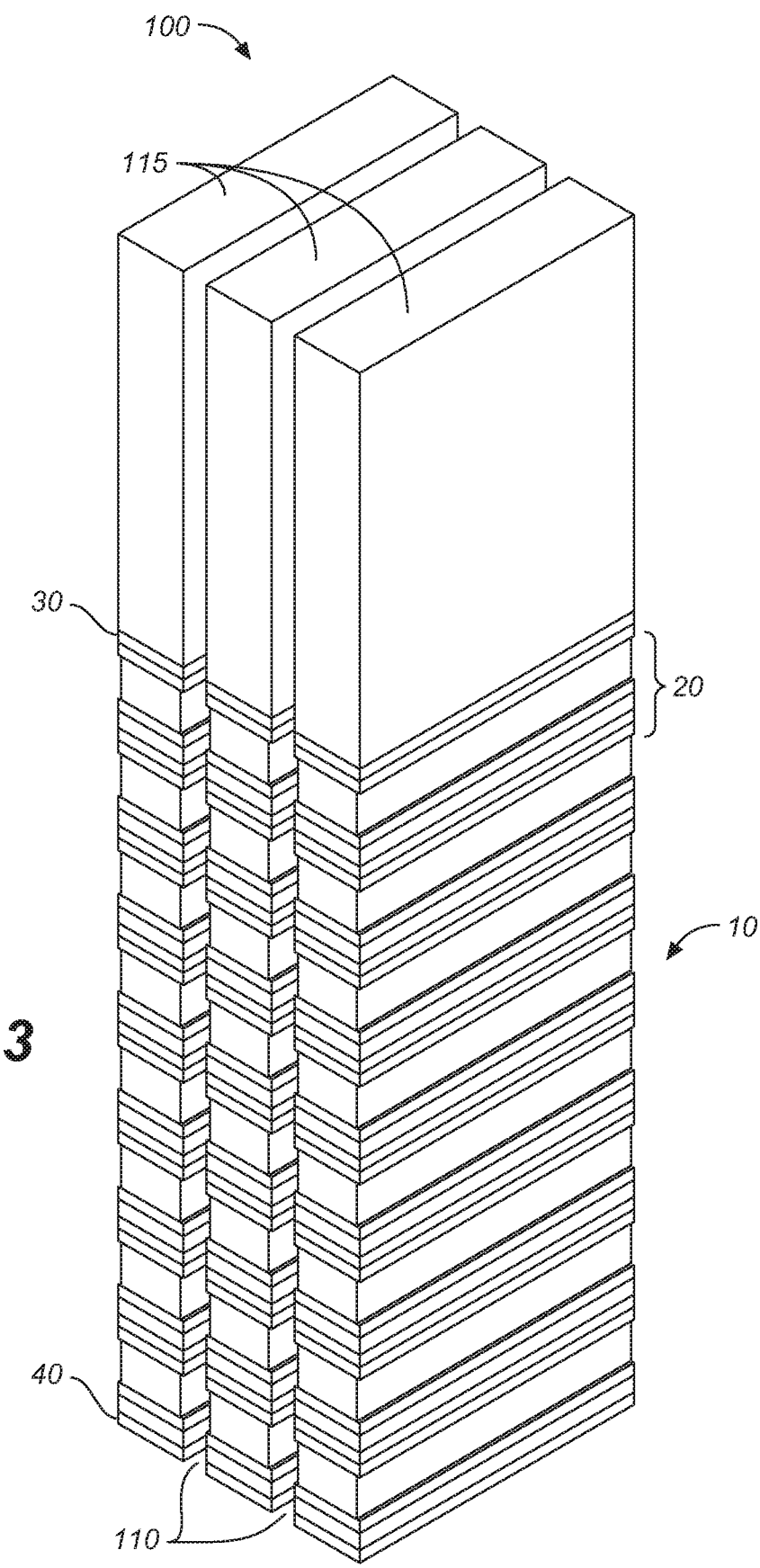
Figure 4:
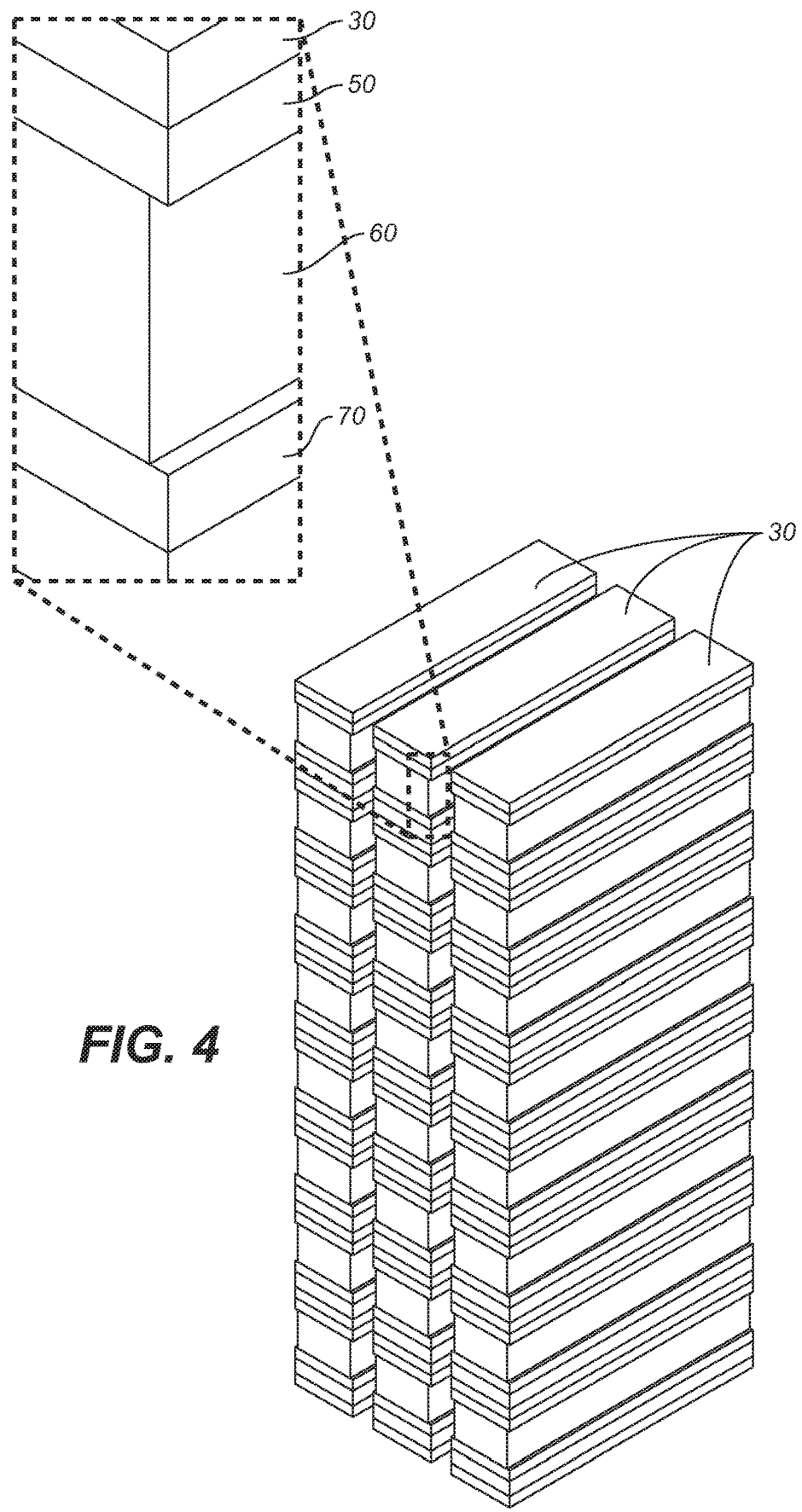

FIG. 3 shows an etching step creating trenches 110 in memory structure 10. Following the etching step of FIG. 3, masking layer 100 is removed, as shown in FIG. 4. Thereafter, SAC1 layer 60 in each active layer exposed to trenches 110 is selectively etched to form a recessed cavity of a predetermined depth (e.g., between 5-10 nanometers), without substantially etching the other layers. The selective etch may be accomplished using any suitable technique, such as by a corrosive gas, a wet chemical acid or a base, preferably by a corrosive gas. FIG. 4 shows a small portion of SAC1 layer 60 is removed by the selective etch from each of the exposed faces of the SAC1 layers on opposite sides of trenches 110.

Figure 5:
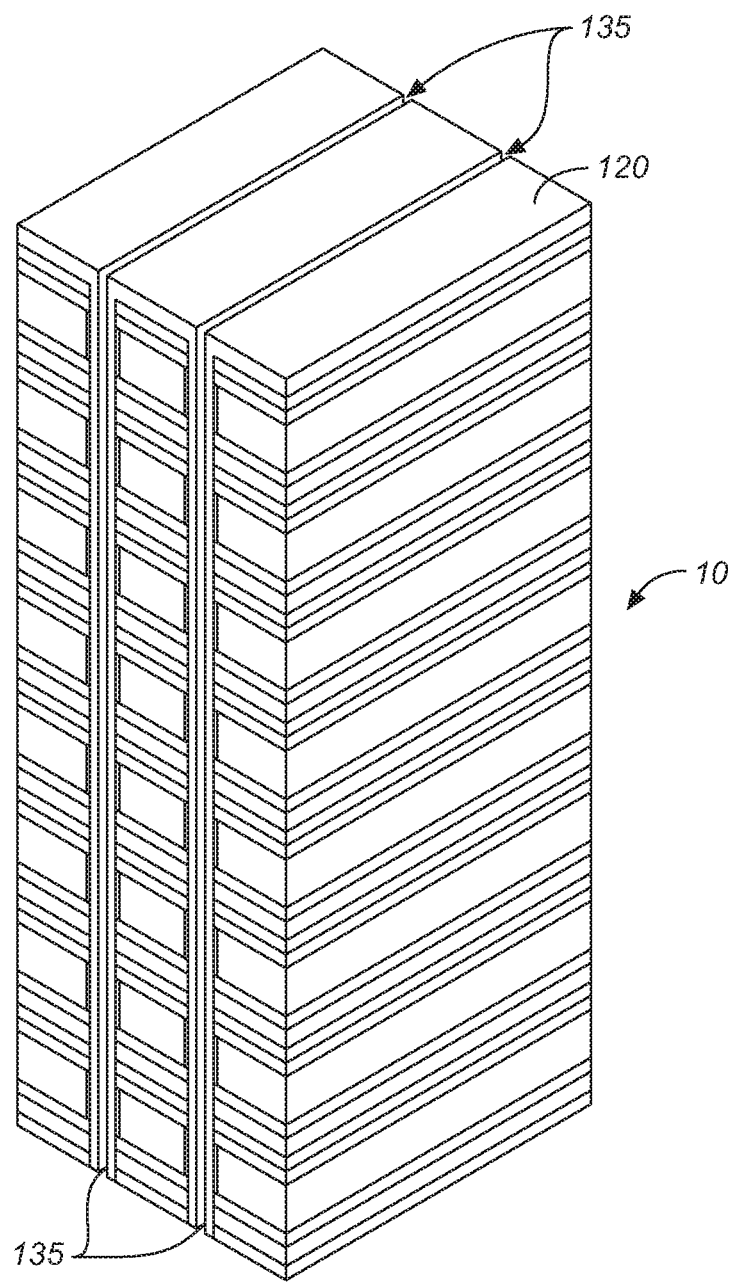
Figure 6:
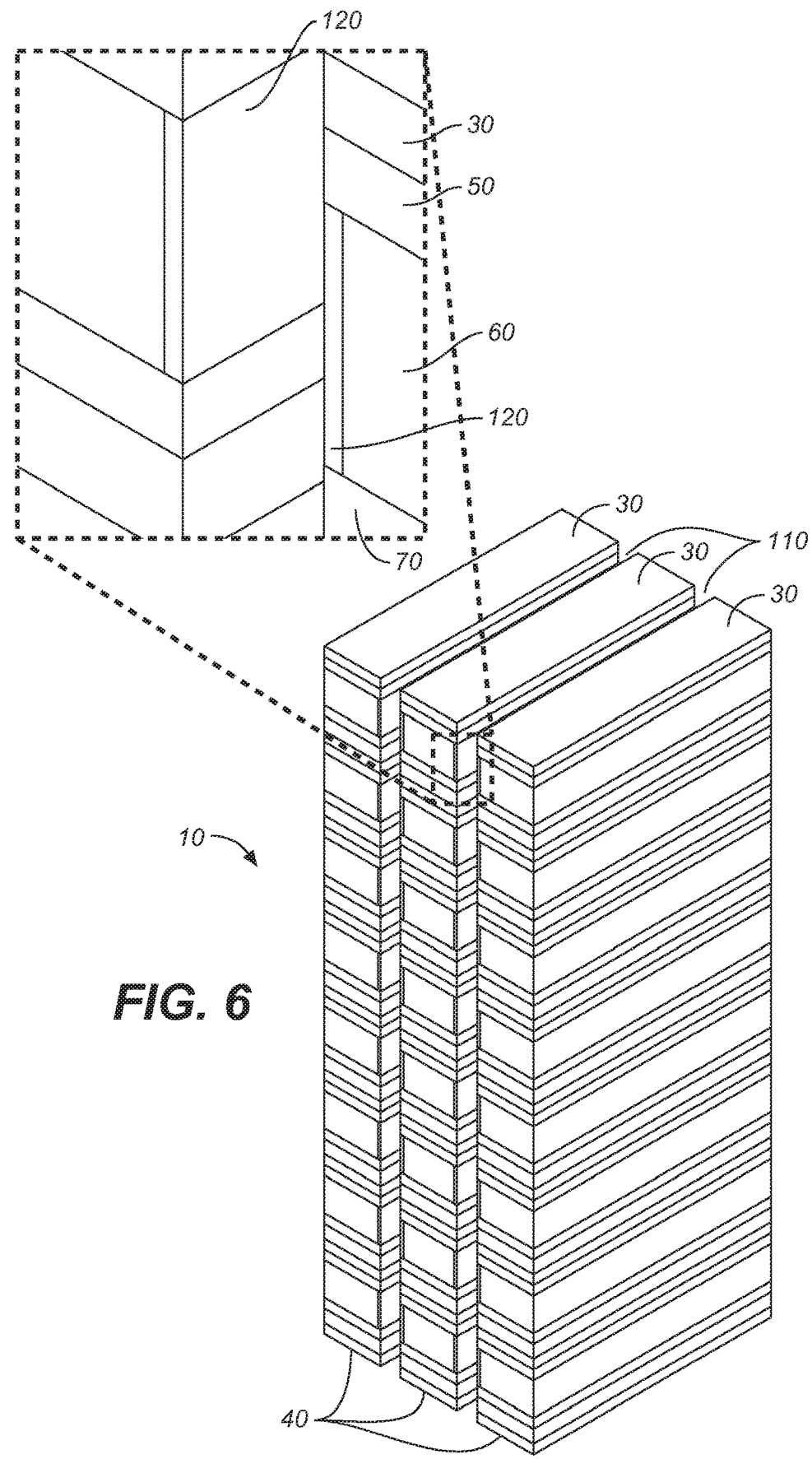

Referring to FIG. 5, trenches 110 are then filled by semiconductor layer 120, which may include any suitable material (e.g., p-type or n-type silicon or silicon germanium, which may be doped in situ), using any suitable technique such as LPCVD or ALD. Semiconductor layer 120 may be conformally deposited to a thickness such that trenches 110 are not completely filled, leaving narrow trenches 135. FIG. 6 shows, after an anisotropic and partially sideway etch, semiconductor layer 120 is removed from trenches 110, except in the recessed cavities in SAC1 layer 60. Semiconductor layer 120 remaining in the recessed cavities will eventually serve as p-type or n-type channels regions for the thin-film NOR transistors to be formed.

Figure 7:
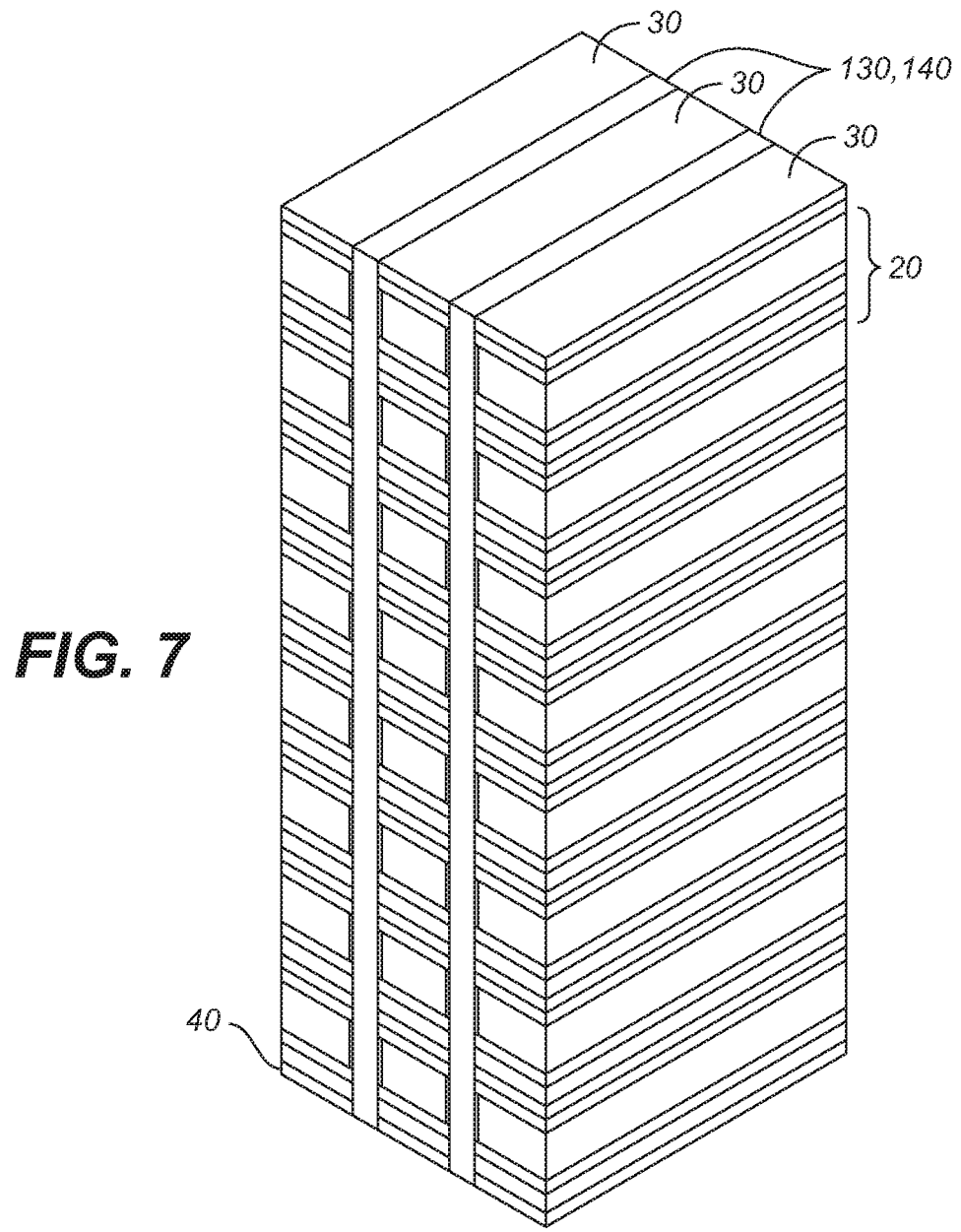

Referring to FIG. 7, trenches 110 are then filled with one or more dielectric materials (e.g., $SiO_2$, SiN, SiON, SiC, porous $SiO_2$, or SiCOH), using any suitable technique, such as LPCVD, PECVD, or ALD, taking care to avoid forming voids. Any dielectric material deposited on top of memory structure 10 may be removed by controlled etching or by CMP (chemical mechanical polishing). In one embodiment, trenches 110 may be filled by two layers of dielectric material: (i) conformal ultra-thin wall-protective layer 130 (e.g., SiN), and (ii) thicker layer 140 (e.g., $SiO_2$), which is deposited over wall-protective layer 130. Dielectric layers 130 and 140 completely fill trenches 110.

Figure 8:
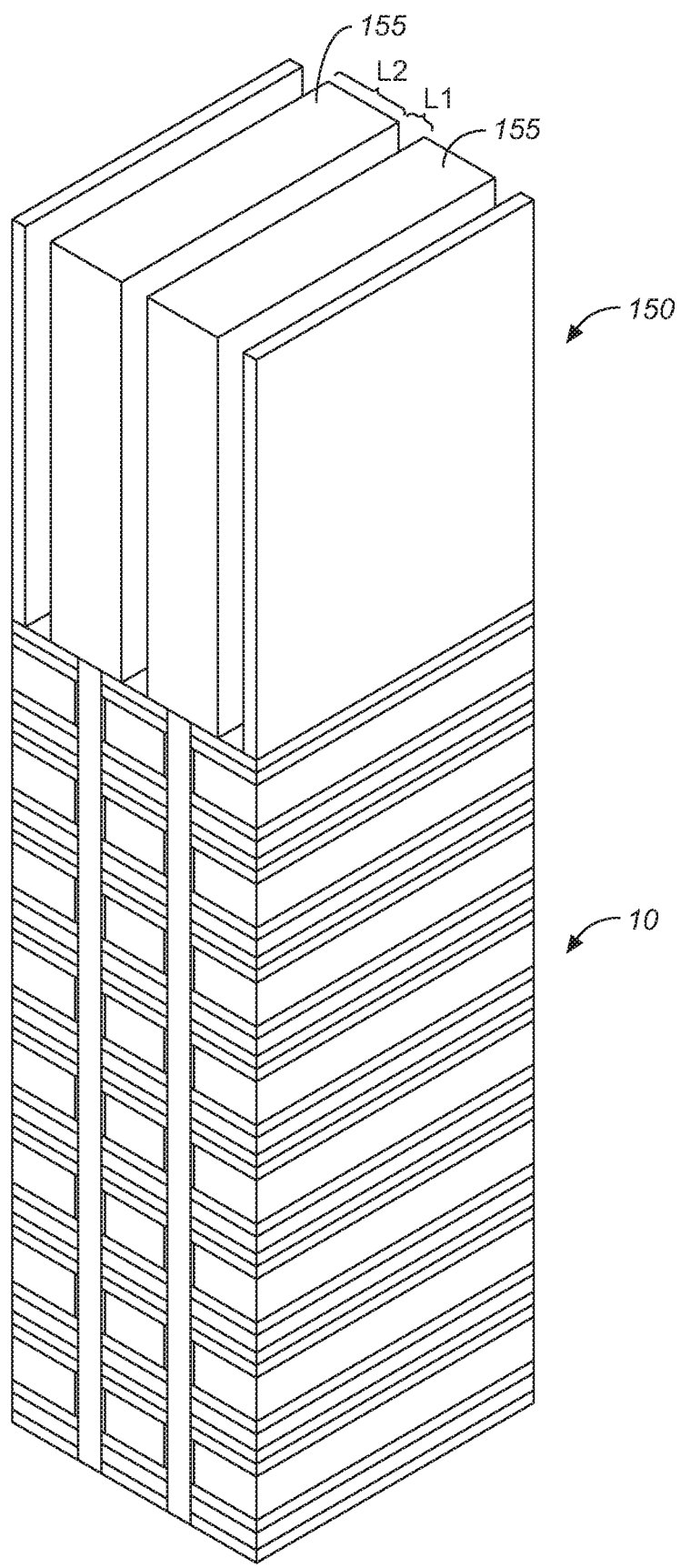

Referring to FIG. 8, a hard mask layer is deposited and patterned to form hard mask structures 155 for use in etching a second set of trenches that are parallel to trenches 110 already formed. As in masking structures 115 of FIG. 2, hard mask structures 155 each have width $L_2$ and each separated from its neighbors by trenches of width $L_1$. Hard mask structures 155 are each shifted relative to the positions of masking structures 115, so as to completely protect trenches 110. Hard mask structures 155 also each extend over the active stacks on both sides of the trench immediately underneath it, so as to overlap each stack by not less than width $L_1$ (i.e., the desired width for each active strip). In practice, due to limitations of existing lithography tools, some misalignment may occur, so that the overlaps of each hard mask structure 155 over the left and right stacks underneath it are not exactly equal. For example, if the target width $L_1$ is 50 nanometers and the worst-case misalignment is ±5 nanometers, then the left-side overlap may be as much as 55 nanometers wide, while the right-side overlap may be as narrow as 45 nanometer wide. This manufacturing variability can be absorbed within the chip design, for example by treating the left and right side thin-film transistors of each stack as belonging to two separate groups, with each group being provided with its dedicated reference transistors or reference memory strings that are constituted from within their respective groups.

Figure 9:
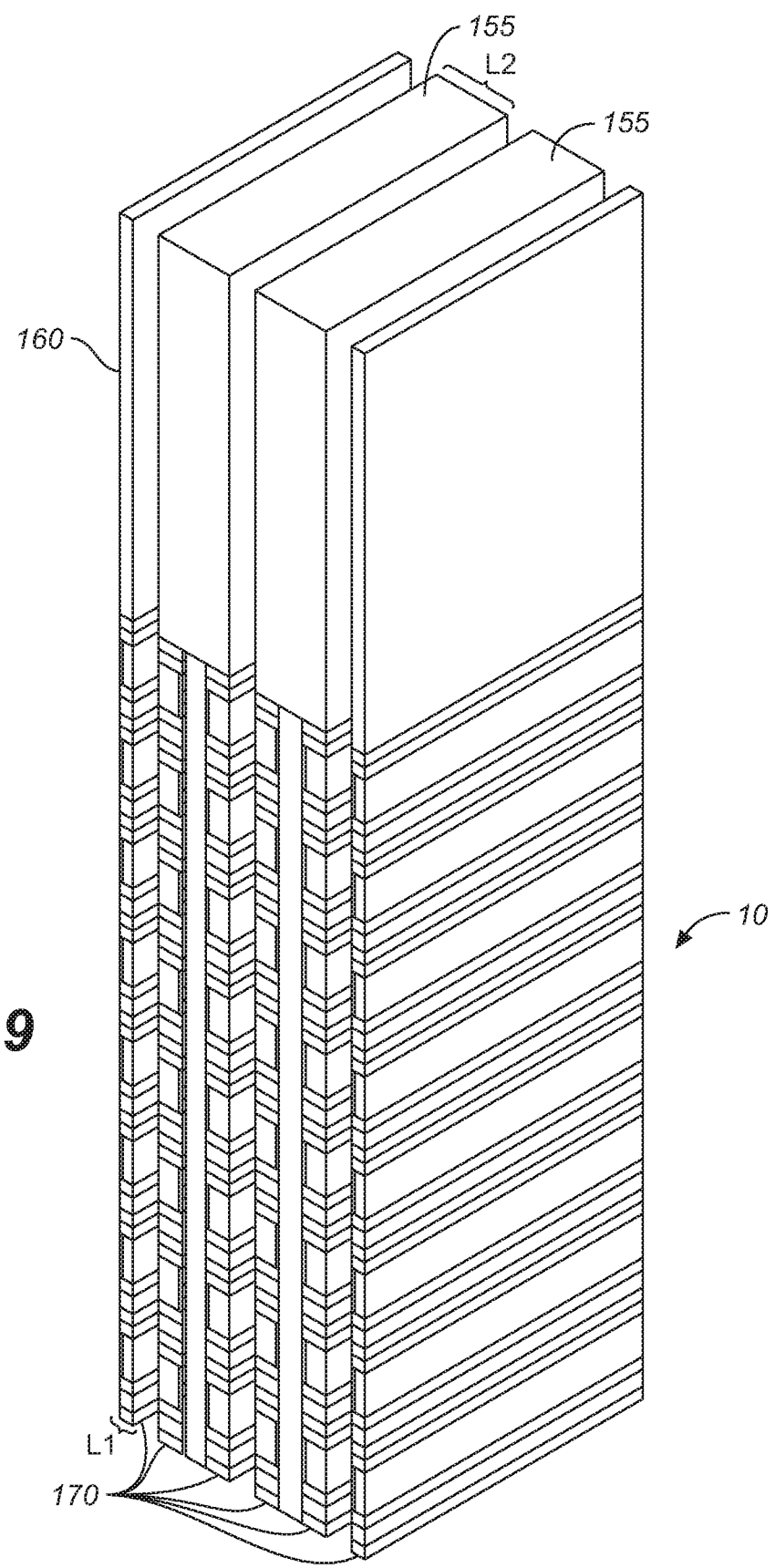
Figure 10:
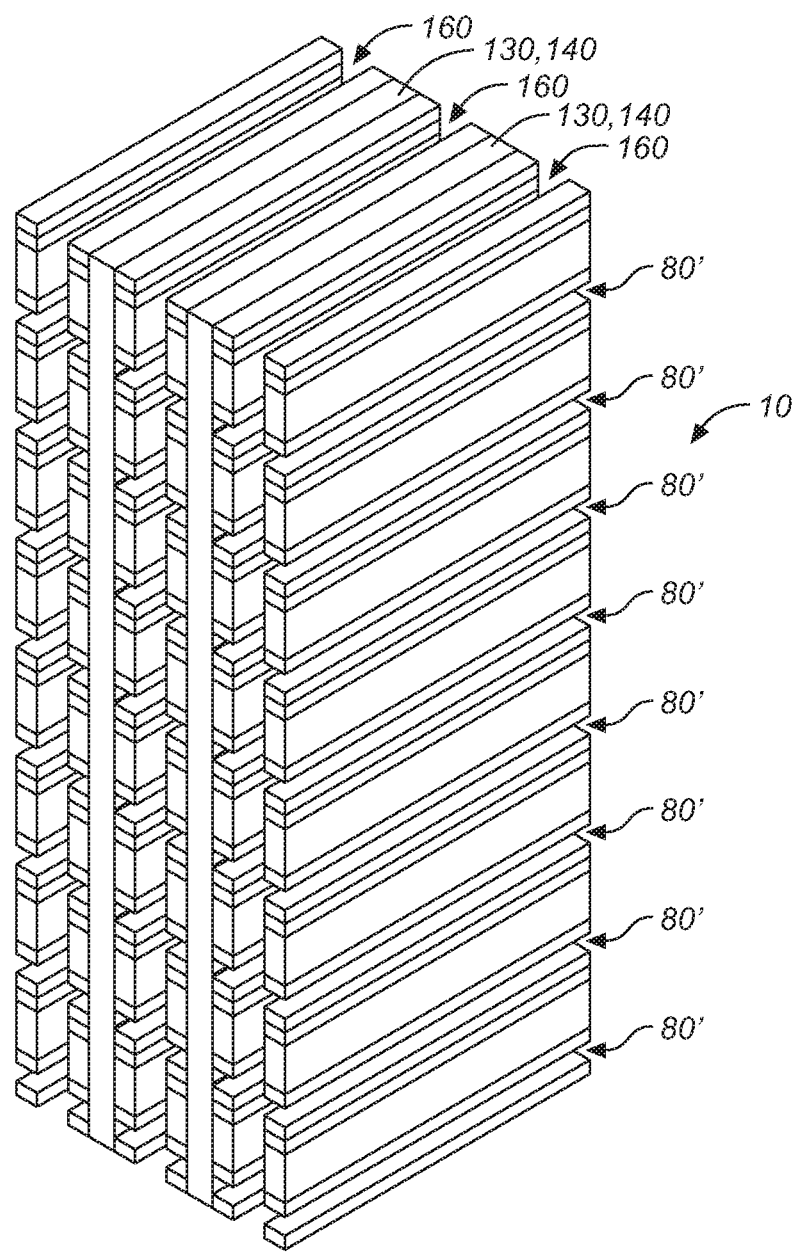

FIG. 9 shows memory structure 10 etched through to provide a second set of trenches 160, thus forming active stacks 170. Each active stack has nominal width $L_1$ that is considerably less than width $L_2$ of masking structure 155. The relatively large width $L_2$ of masking structure 155 prevents ribboning. Referring to FIG. 10, SAC4 layer 80 is removed by a selective etching step initiated from the exposed sidewalls of trenches 160 (the space in each active strip previously occupied by SAC4 80 is now indicated in FIG. 10 by reference numeral 80'). Such etching may be accomplished using any suitable technique (e.g., etch by a corrosive gas, a wet chemical acid or a base). For example, a SiN layer, suitable for implementing SAC4 layer 80, may be removed by wet etching in phosphoric acid heated to 180° C. Etching stops when SAC4 layer 80 is etched all the way to filler materials 130 and 140 in trenches 110. As dielectric material layers 130 and 140 are not etched, their support allows active stacks 170 to maintain their intended structural forms (i.e., each narrow, long and tall along the entire length), even though the constituent SAC4 layer 80 in each active strip is removed, thereby creating cavities or discontinuities in active stacks 170. Note that braces placed at suitable intervals are not needed to support the narrow active stacks 170 under existing state-of-the-art technology. However, such braces may be required in the future for highly scaled 3-dimensional HNOR memory arrays when width $L_2$ becomes even narrower, or when the active stacks are exceedingly tall (e.g., the number of active strips is exceedingly large), so that it becomes prudent to support the very long active stacks at suitable intervals.

Figure 11:
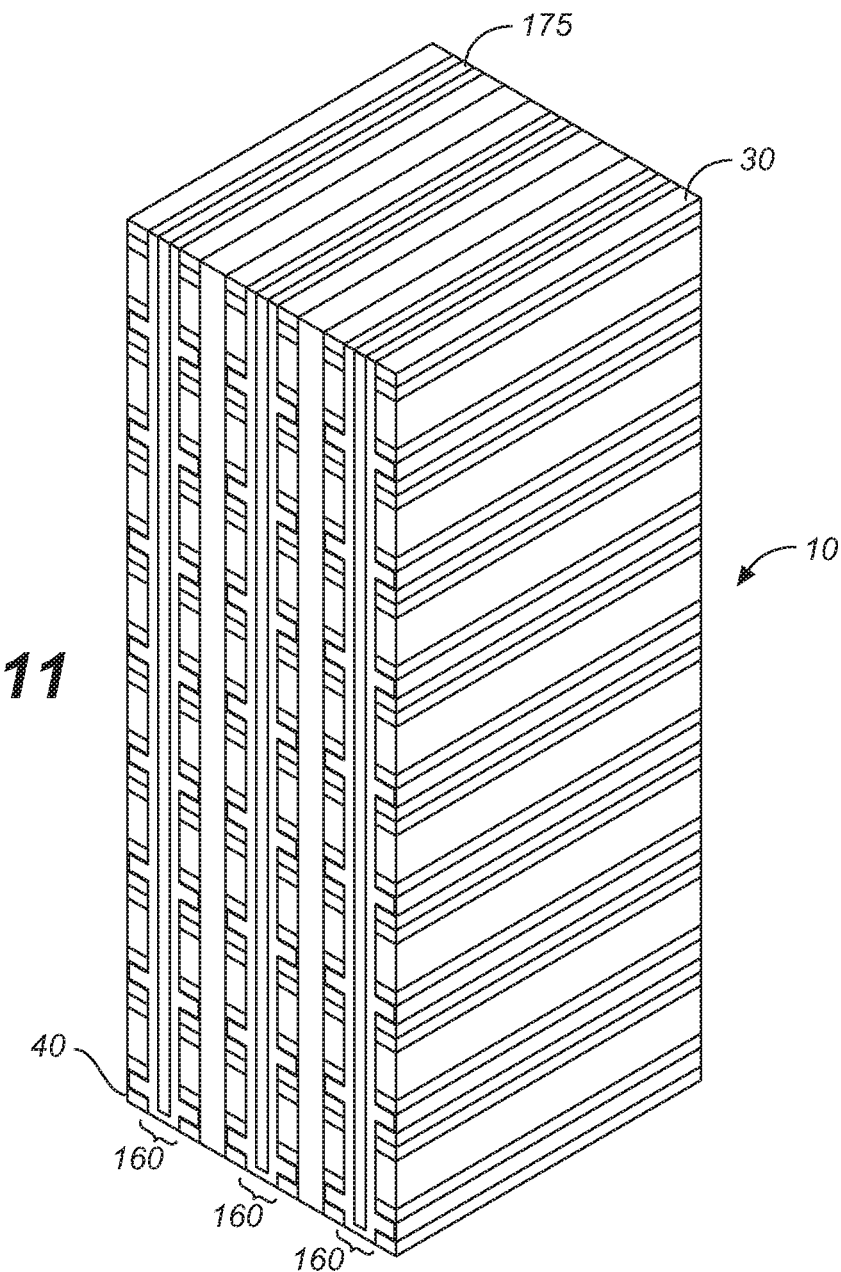
Figure 12:
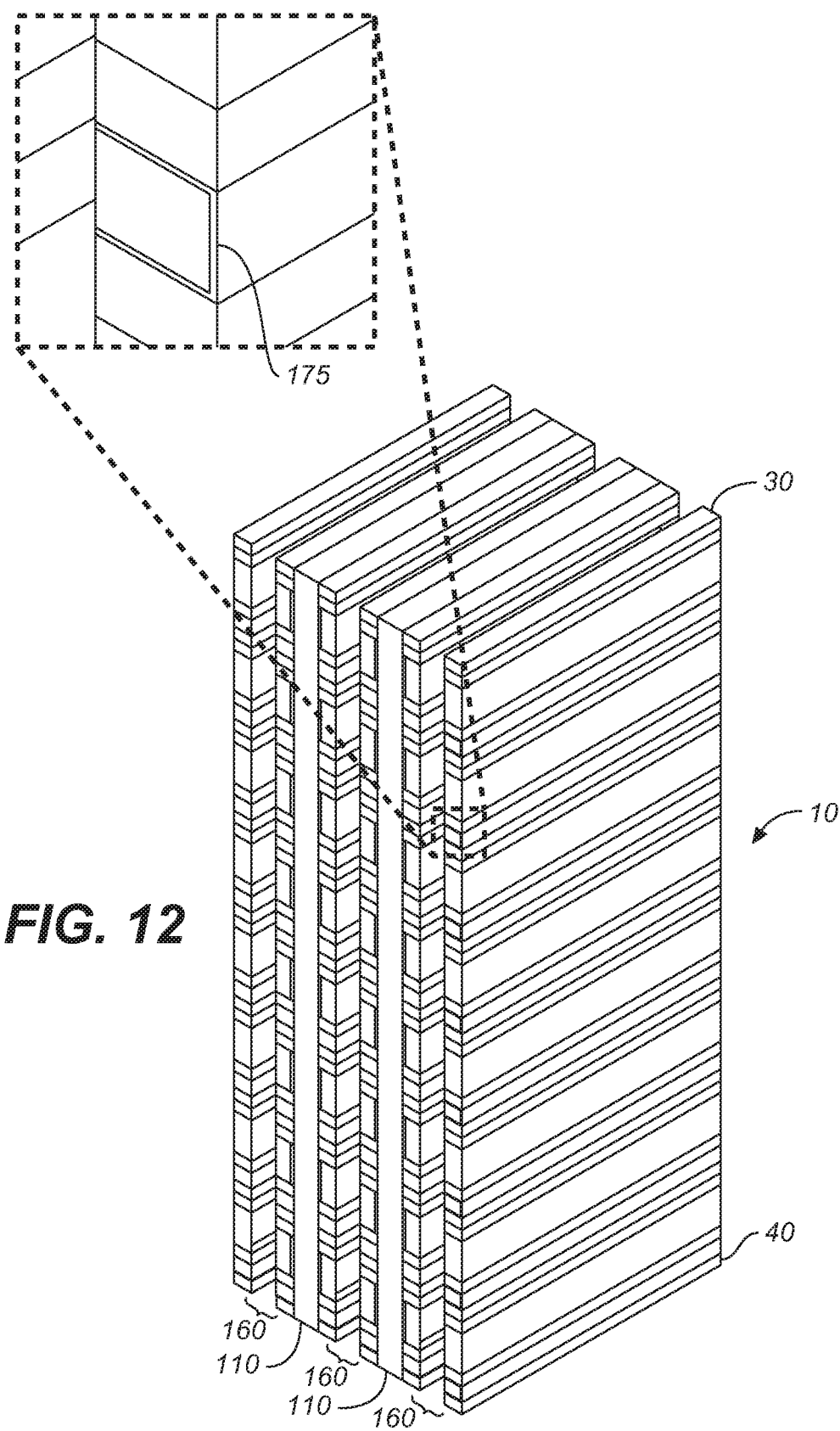

FIG. 11 shows both the sidewalls of trenches 160 and the selectively etched cavities in the active strips are filled by a metal, thereby in effect replacing SAC4 layer 80—which was removed by the selective etching—by metal layer 175. (Note that trenches 160 are preferably not completely filled). Metal layer 175 may include any suitable material (e.g., TiN, TaN, Ta, W, Mo, or any combination thereof). FIG. 11, for example, shows metal layer 175 to be a combination of a thin TiN layer and a relatively thicker tungsten (W). Metal layer 175 is then removed from the sidewalls of trenches 160 by a suitable etch, leaving metal layer 175 only in the active strips, as shown in FIG. 12. In some embodiments, metal layer 175 is further recessed by selectively etching up to approximately 6 nanometers away from the sidewalls of trenches 160, so as to accommodate an oxide cap layer or silicon barrier cap layer to be placed therein, as is known by those of ordinary skill in the art. The oxide cap layer or silicon barrier cap layer separates metal layer 175 from directly contacting a charge trapping layer yet to be formed. A similar metal replacement scheme is disclosed in the Non-provisional application.

Figure 13:
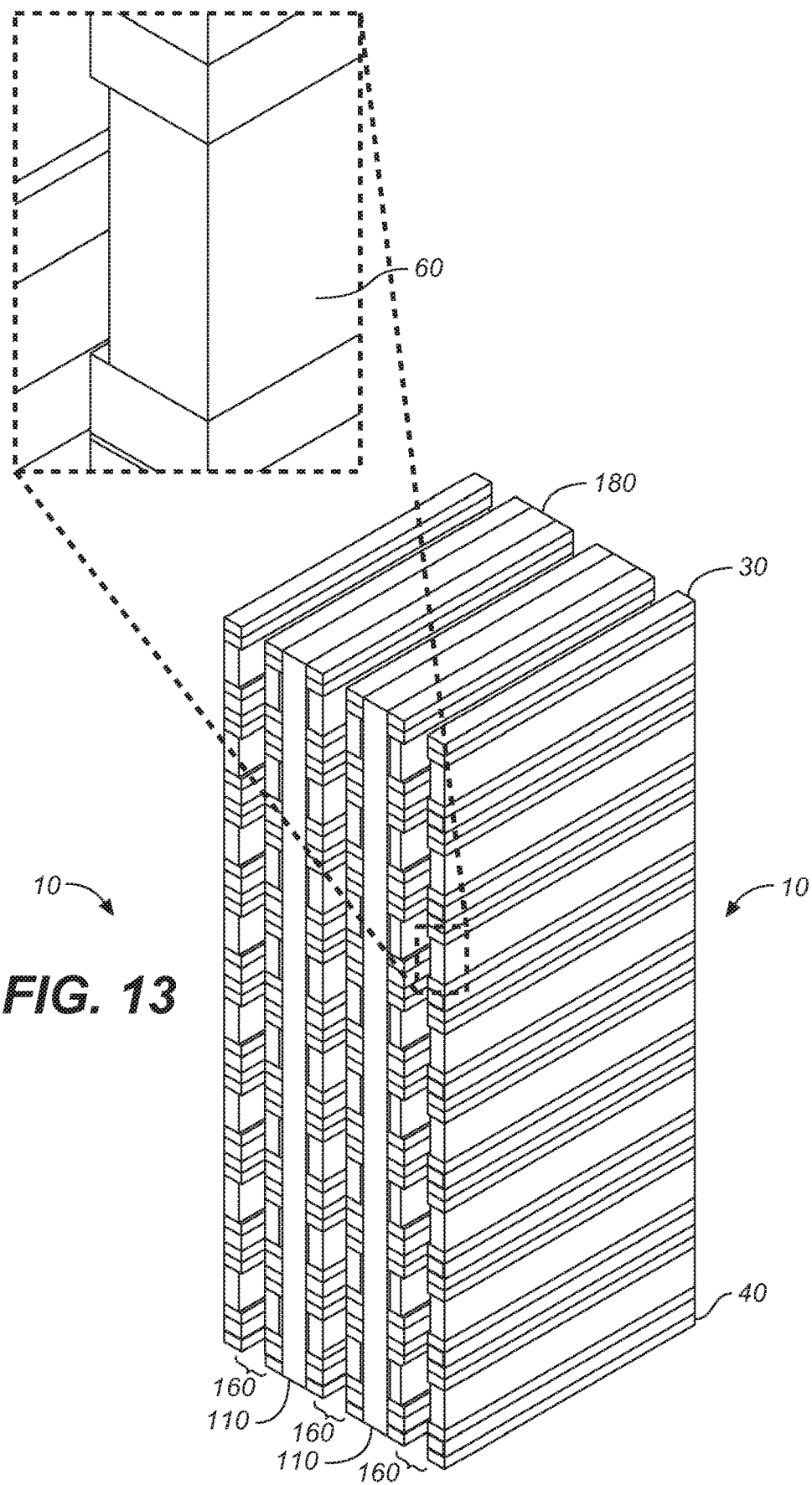
Figure 14:
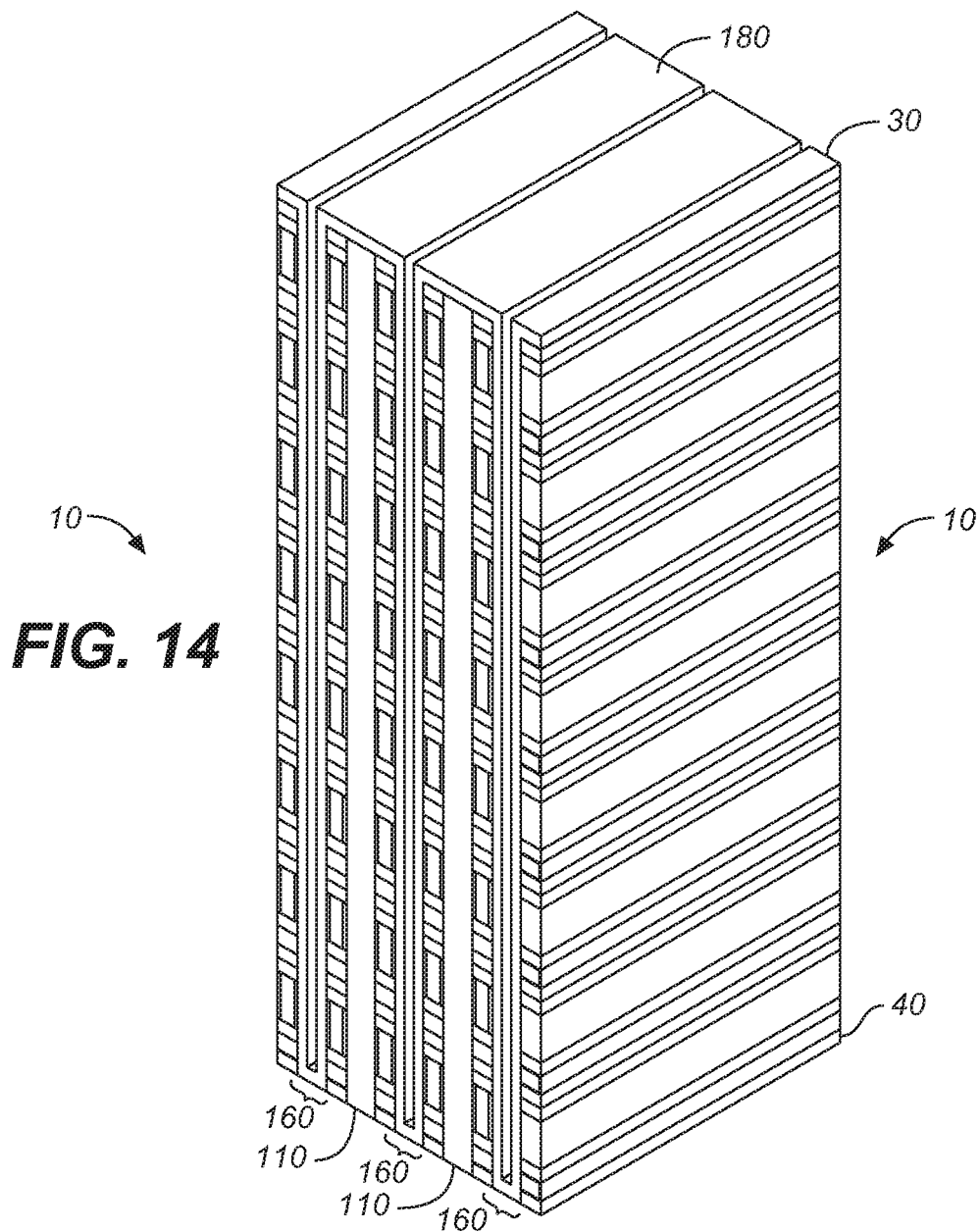
Figure 15:
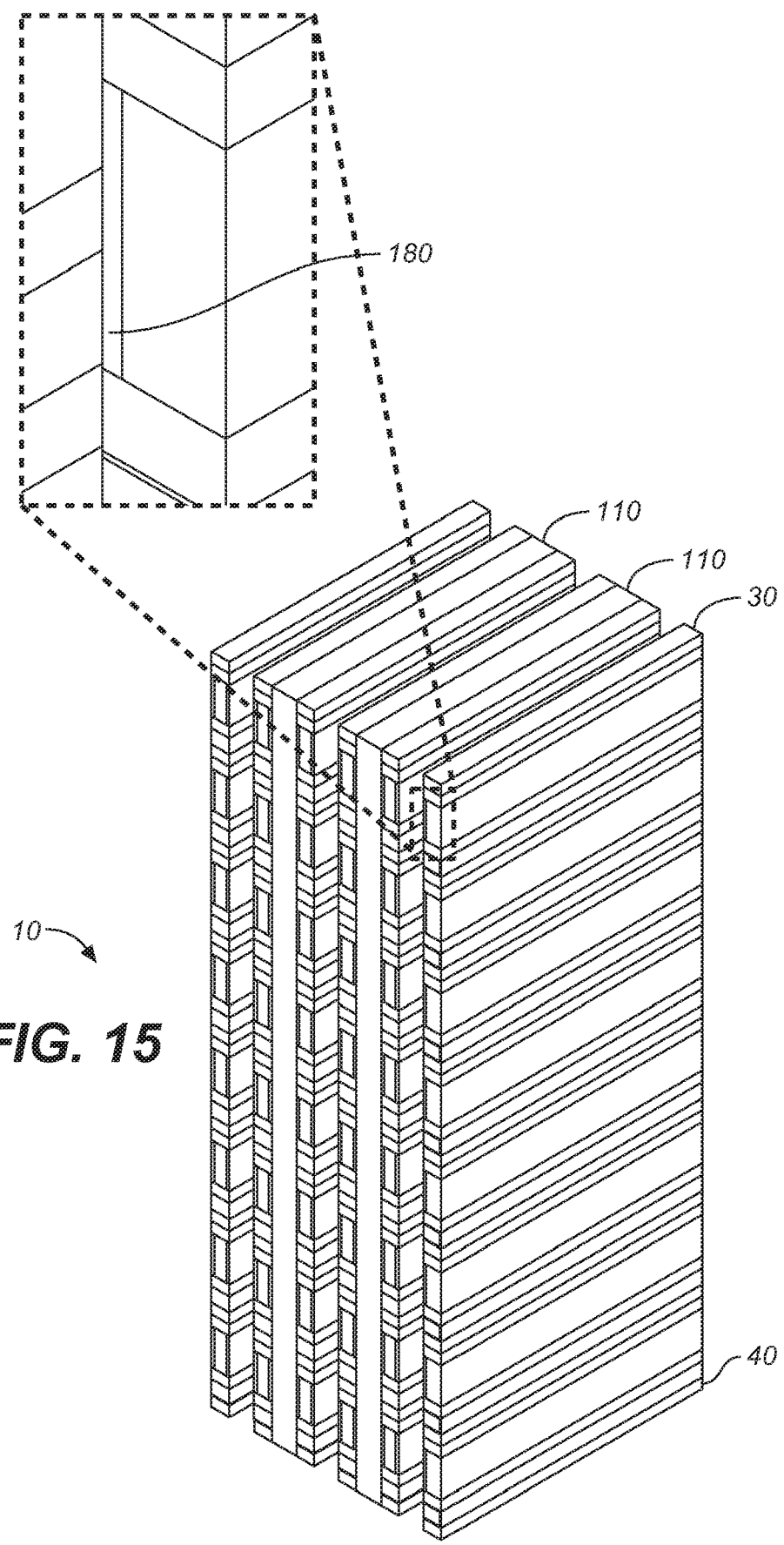

Note that the side walls of the active strips exposed in trenches 160 include surfaces of SAC1 layer 60. FIG. 13 shows, after a second selective etch of SAC1 layer 60, a recessed portion of SAC1 layer 60 is formed in each active strip, similar to the recessed portion of SAC1 layer 60 facing trenches 110 previously discussed in conjunction with FIG. 4. Referring to FIG. 14, semiconductor layer 180 is then deposited to fill trenches 160 and the recessed portions of SAC1 layer 60. Semiconductor layer 180 need only partially fill trenches 160. FIG. 15 shows, after an etch of semiconductor layer 180, semiconductor layer 180 is left only in the recessed portions of SAC1 layer 60 in the active strips and any recessed portion in metal layer 175.

Figure 16:
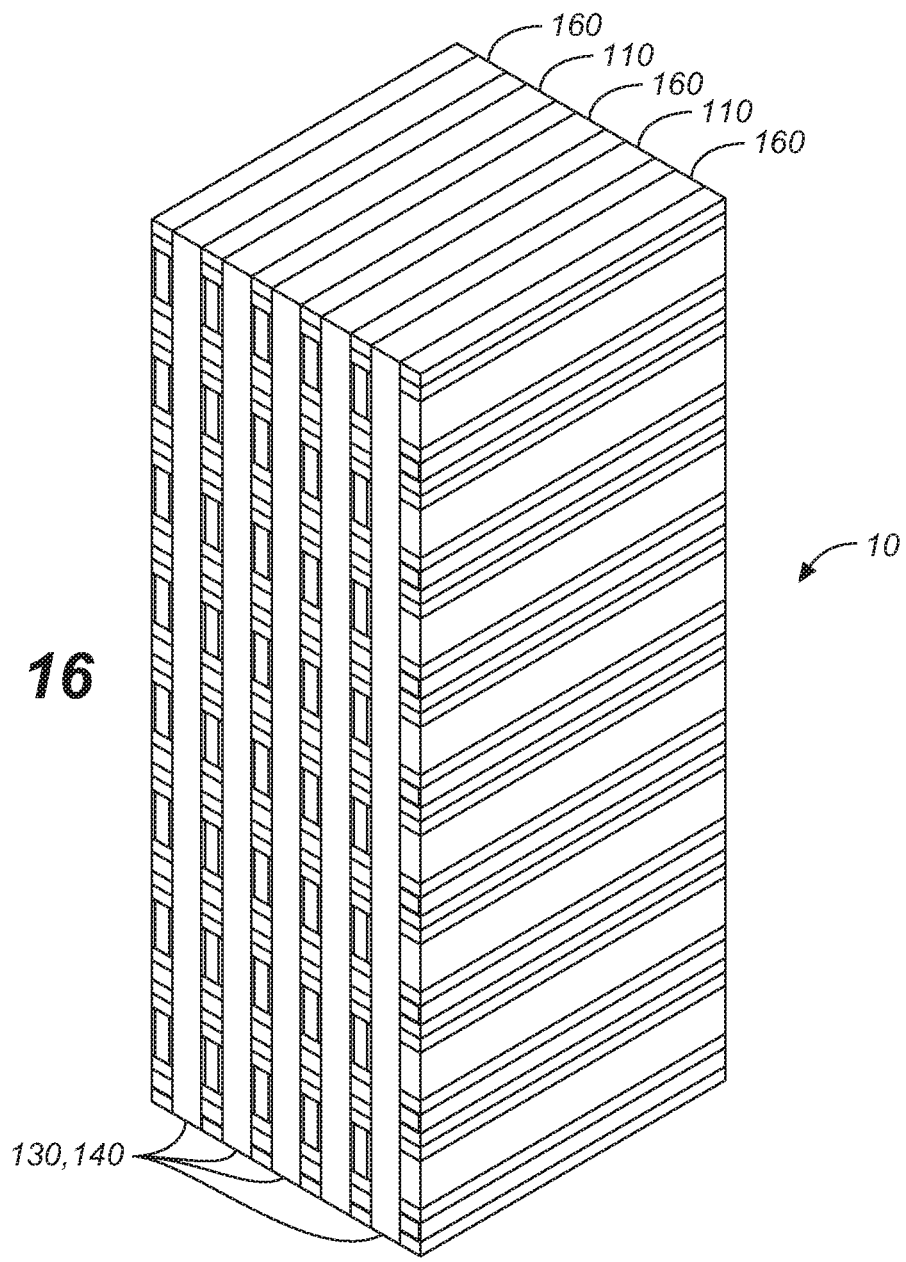

Thereafter, as shown in FIG. 16, trenches 160 are filled with dielectric material 130 and 140, taking care to avoid forming voids, in the manner described above with respect to filling of trenches 110.

At this stage, the eight active layers are formed into stacks of narrow active strips, with each active strip having a source layer, a drain in contact with a replaced metal layer (i.e., a bit line) and recessed semiconductor strips on opposite sides of the active strip between, and in contact with, the source and drain layers. These layers are provided for forming a common source region, a common drain region and channel regions, respectively, for transistors to be formed along both side edges of the active strip. (Of course, the process flow described above may be simplified by forming active strips with the recessed channels only on one side. Such active strip provides only one half the number of possible transistors along the active strip). To complete the 3-dimensional HNOR memory array, the next process steps provide charge trapping layers, the local word lines that serve as control gates, and the global word lines above and below memory structure 10 to connect the local word lines to circuitry in the semiconductor substrate. Further, a staircase structure is formed for conductors to interconnect the bit lines for the memory strings in the HNOR memory array with CMOS logic devices in the semiconductor substrate (e.g., sense amplifiers, decoders, and control and input or output logic devices). These process steps are next discussed.

Figure 17:
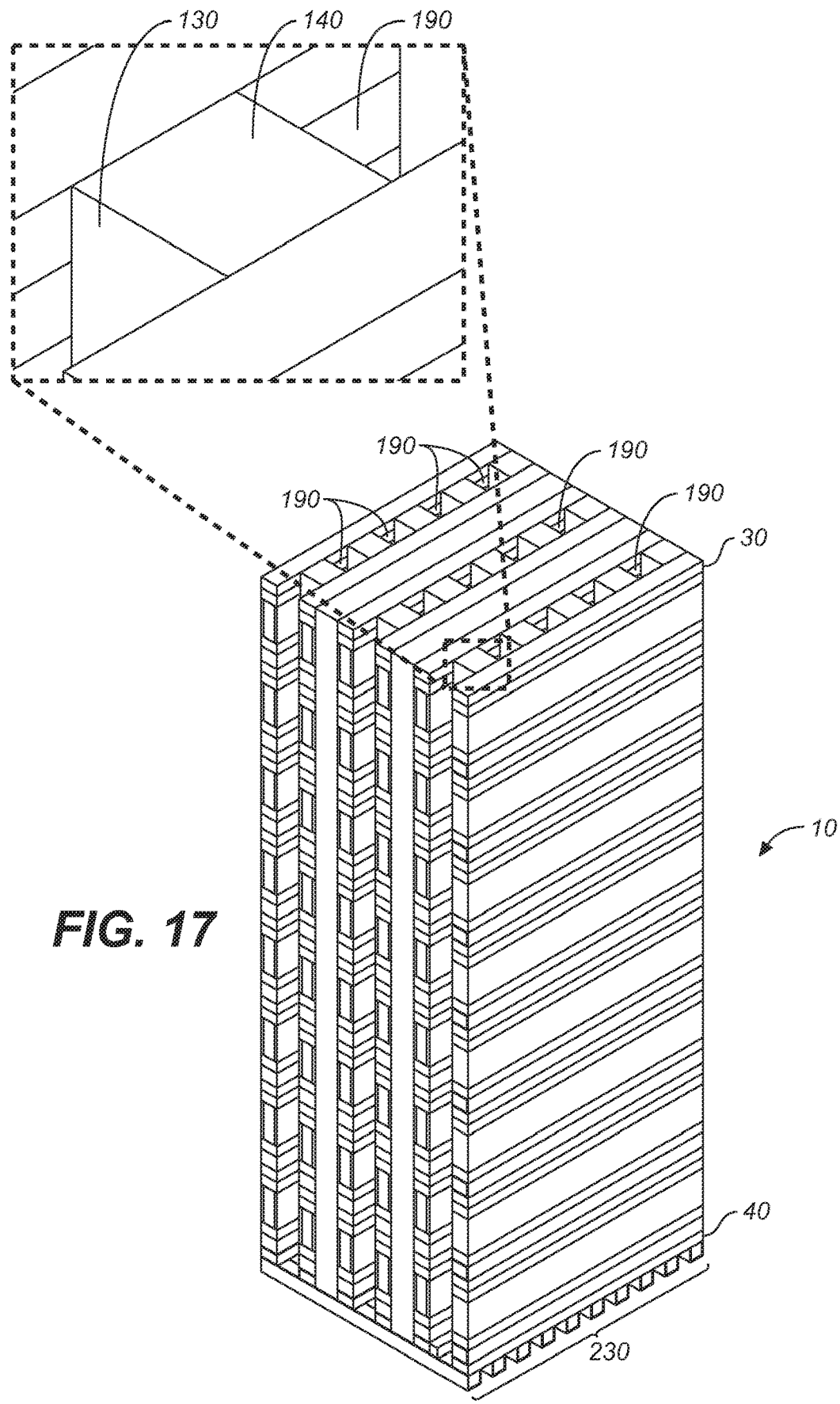

FIG. 17 shows portions of dielectric layers 130 and 140 in trenches 160 are patterned and etched (e.g., using a masking layer (not shown)) to form a first set of shafts (labeled in FIG. 17 by reference numerals 190) that extends to the bottom of memory structure 10. Dielectric layer 140 may include $SiO_2$, for example, which may be removed using a corrosive gas anisotropic etch with a high-power biased plasma, or another suitable etching. Dielectric layer 130 may include SiN, for example, which protects the exposed portions semiconductor layers (i.e. source layer 50, drain layer 70, and deposited semiconductor layers 120 and 180) from damage during the high-power biased plasma etching. Dielectric layer 130 may be subsequently removed using a wet chemical etch (e.g., hot phosphoric acid), which does not damage the semiconductor layers. In another embodiment, a second set of shafts 190 (not shown in FIG. 17) is formed simultaneously also in dielectric layers 130 and 140 of trenches 110.

Figure 18:
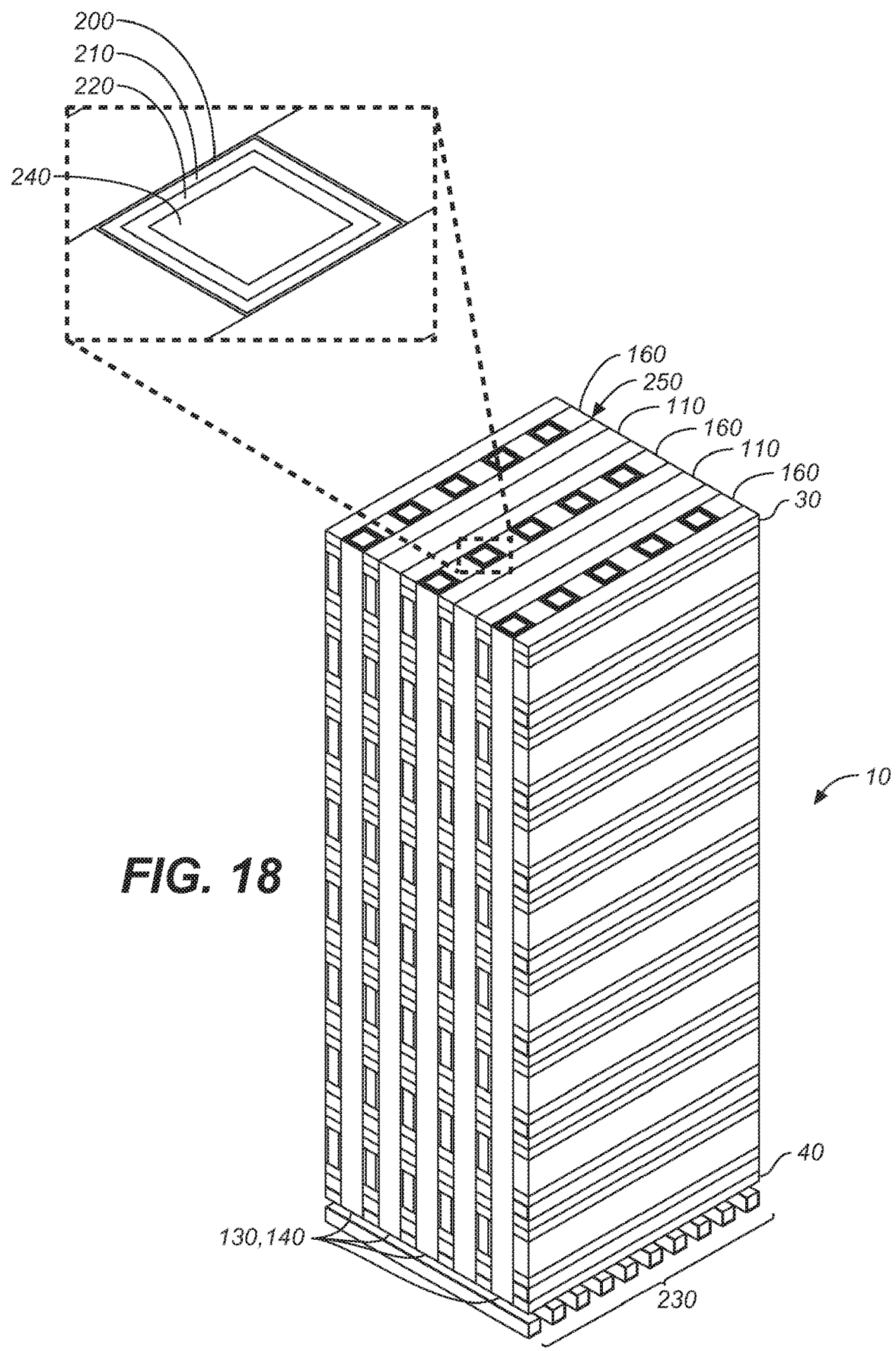

Referring to the inset of FIG. 18, tunneling oxide layer 200, charge storage layer 210, and blocking dielectric layer 220 are then successively and conformally deposited into the shafts 190 of trenches 160. Tunneling oxide layer 200 may include $SiO_2$, charge storage layer 210 may include SiN or silicon-rich SiN, and blocking dielectric layer 220 may include $SiO_2$, $Al_2O_3$, $HfO_2$, another dielectric material or any combination of two or more of these dielectric materials. Layers 200, 210, and 220 may be deposited using any suitable method (e.g., CVD or ALD). In some embodiments, to ensure good material quality in these layers, an annealing step may be performed after their depositions.

Thereafter, an anisotropic etch punches through and opens a via through tunneling oxide layer 200, charge storage layer 210 and blocking dielectric layer at the bottom of each shaft in trenches 160, as well as the insulation layer between the bottom of memory structure 10 and global word lines 230 (shown in inset) or other landing pads (not shown), so as to connect to circuitry below memory structure 10 (e.g., in the semiconductor substrate). A thin layer of silicon (not shown) may be first deposited over the sidewalls of blocking dielectric layer 220 to protect it during the via etch. Gate layer 240 is then deposited to fill each shaft to form a "local word line." Each local word line extends in along direction perpendicular to the surface of the semiconductor substrate. As shown in the left inset of FIG. 18, each local word line makes contact to one of global word lines 230 formed prior to the depositions of the active layers of memory structure 10. Global word lines 230 connect the local word lines to circuitry in the semiconductor substrate or elsewhere. Gate layer 240 may include any suitable conductive material, such as (i) an n-type or p-type heavily doped silicon, silicon germanium or another semiconductor, or (ii) a metal (e.g., TiN, TaN, Ti, Ta, Mo or W, or any combination of two or more such metals), preferably a metal with a high metal work function, deposited using any suitable technique, such as CVD or ALD. The top surfaces of tunneling layer 200, charge storage layer 210, blocking dielectric layer 220, and gate layer 240 may be planarized using a planarization technique (e.g., CMP or etch back) to provide surface 250 which is substantially parallel to the planar surface of the underlying semiconductor substrate (not shown).

Figure 19:
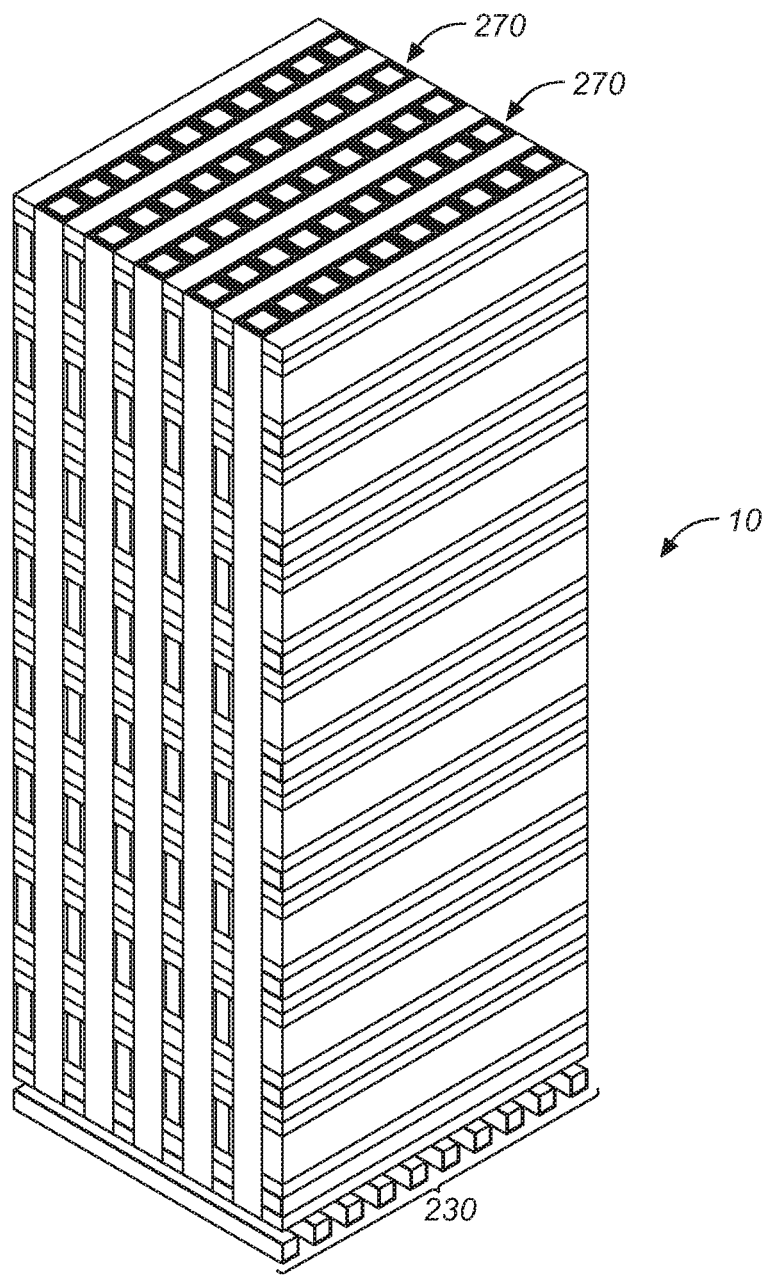
Figure 20:
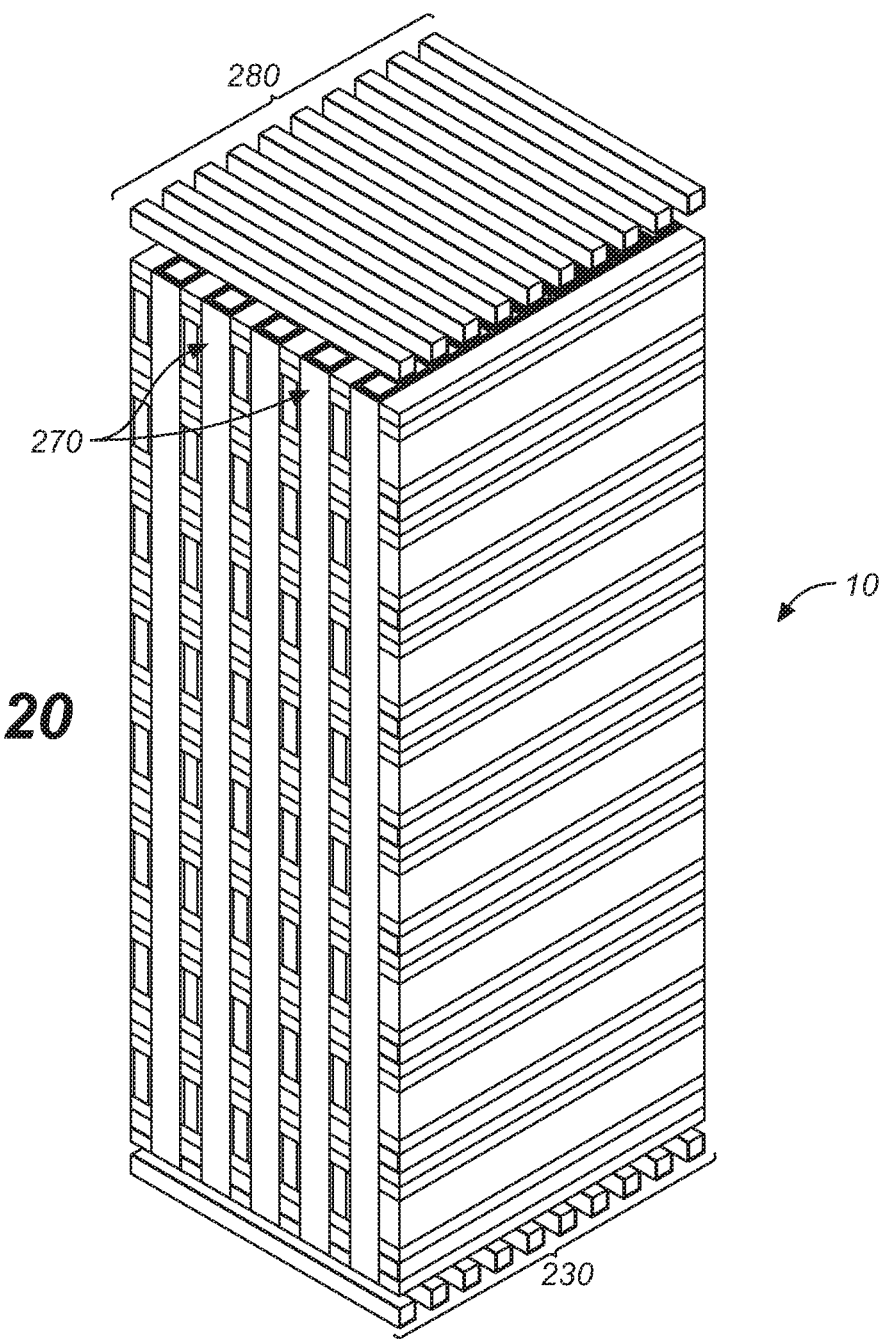

The steps of FIGS. 17 and 18, which pattern and etch shafts 190 in dielectric layers 130 and 140 of trenches 160, deposit layers 200, 210 and 220, fill the rest of the shafts by gate layer 240 to form local word lines, and connect the local word lines to global word lines 230 are repeated to form a second set of local word lines in trenches 160. (In another embodiment, similar shafts are simultaneously etch in both trenches 110 and trenches 160; furthermore, the shafts in trenches 110 and 160 may be staggered with respect to each other.) Thereafter, the steps of FIGS. 17-19 are also repeated in trenches 110 to form another set 270 of local word lines. In one embodiment, the local word lines in trenches 160 are staggered relative to the local word lines in trenches 110, to provide additional spatial separation between local word lines in adjacent rows. In one embodiment, this second set 270 of local word lines in trenches 110 are not made to connect to global word lines 230 (e.g., by skipping the via opening step at the bottom of the shafts). Instead, set 270 of local word lines are connected to another set of global word lines to be formed. FIG. 20 shows global word lines 280 formed above the memory structure 10, which are provided to connect circuitry in the semiconductor substrates and elsewhere to set 270 of local word lines. Formation of local word lines for a HNOR memory array at a very fine pitch is also disclosed in the Provisional application III incorporated by reference above.

In some embodiments, for die size considerations, it may be advantageous to place some circuitry (e.g., decoding circuits, and some read, write and erase supply voltage sources) that is electrically connected through global word lines 230 or global word lines 280 in a part of the semiconductor substrate that is directly underneath memory structure 10. (These decoding circuits and voltage sources are not shown in FIG. 20.) Electrical connections between global word lines 230 and these circuits in the semiconductor substrate are readily available. To electrically connecting these circuits in the semiconductor substrate to global word line 280 above memory structure 10 may require providing vertical connectors provided on one or more sides of memory structure 10 and horizontal connectors to be placed between global word lines 230 and the circuits in the semiconductor substrate. In one embodiment, such circuitous paths may be avoided by providing vertical conductors connecting global word lines 280 to the circuits in the semiconductor substrate directly through the densely packed memory structure 10 and the densely spaced global word lines 230. These vertical conductors may be implemented by having selected ones of the local word lines 270 (FIG. 19) to also serve as conductors for connecting to the circuits in the semiconductor substrate. To establish electrical paths using these vertical conductors may require an extra mask and an etch step to punch-through via openings at the bottom of their respective shafts at locations directly above or close to where such circuits are placed in the semiconductor substrate.

In some embodiments, global word lines 230 underneath memory structure 10 need not be formed when local word lines 240 are all connected to global word lines 280 formed above memory structure 10. Such an arrangement obviates the punch-through masking and etch steps required to form the vias at the bottom of shafts 190. Conversely, local word lines 240 may all be contacted through the punch-through vias to global word lines 230 at the bottom of memory structure 10. In either case, one of the two sets of global word lines may be obviated, provided that the global word lines have approximately one-half the pitch of global word lines 230 or global word lines 280, which may require double exposures or more advanced lithography.

Figure 21:
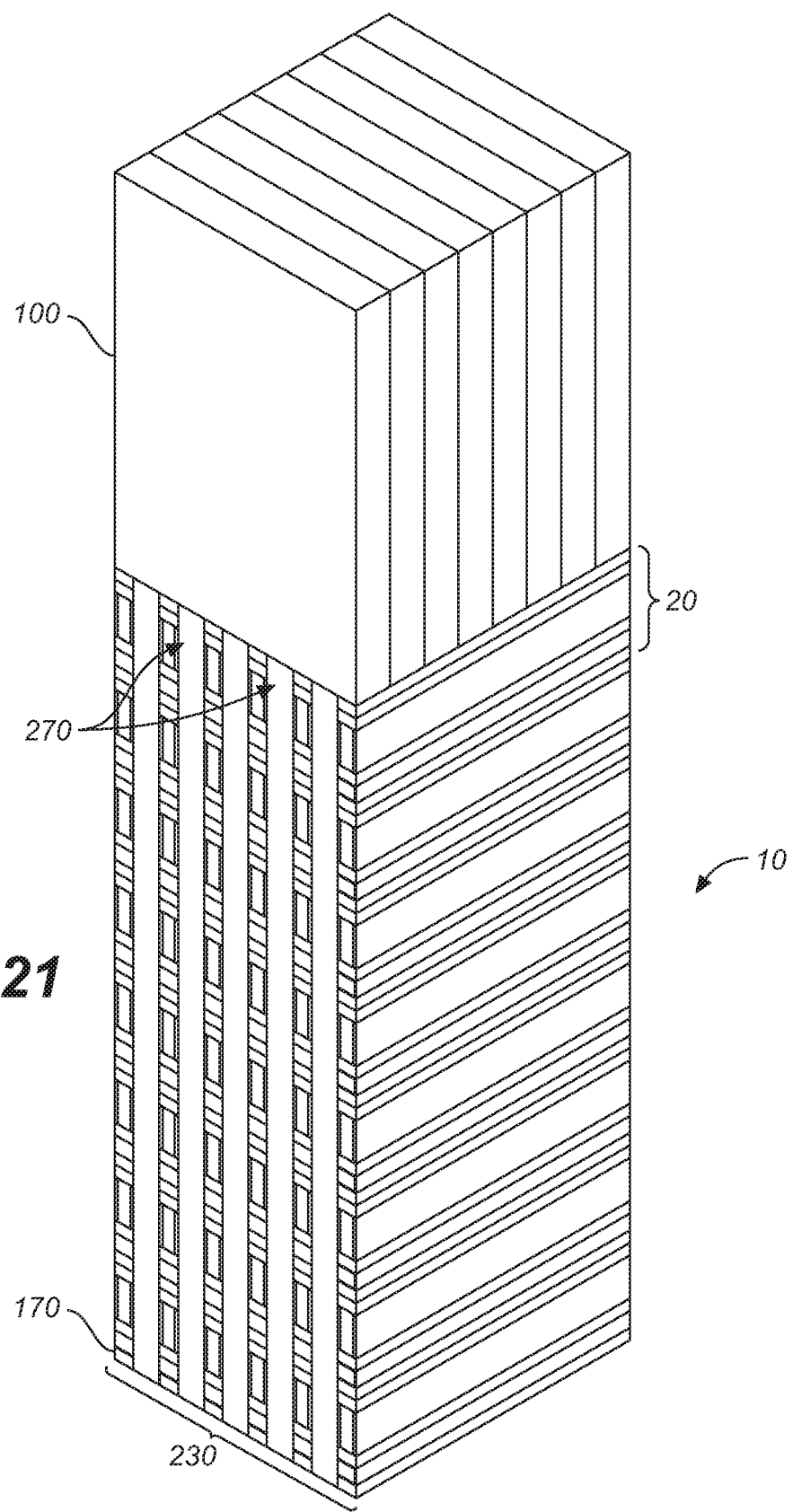
Figure 22:
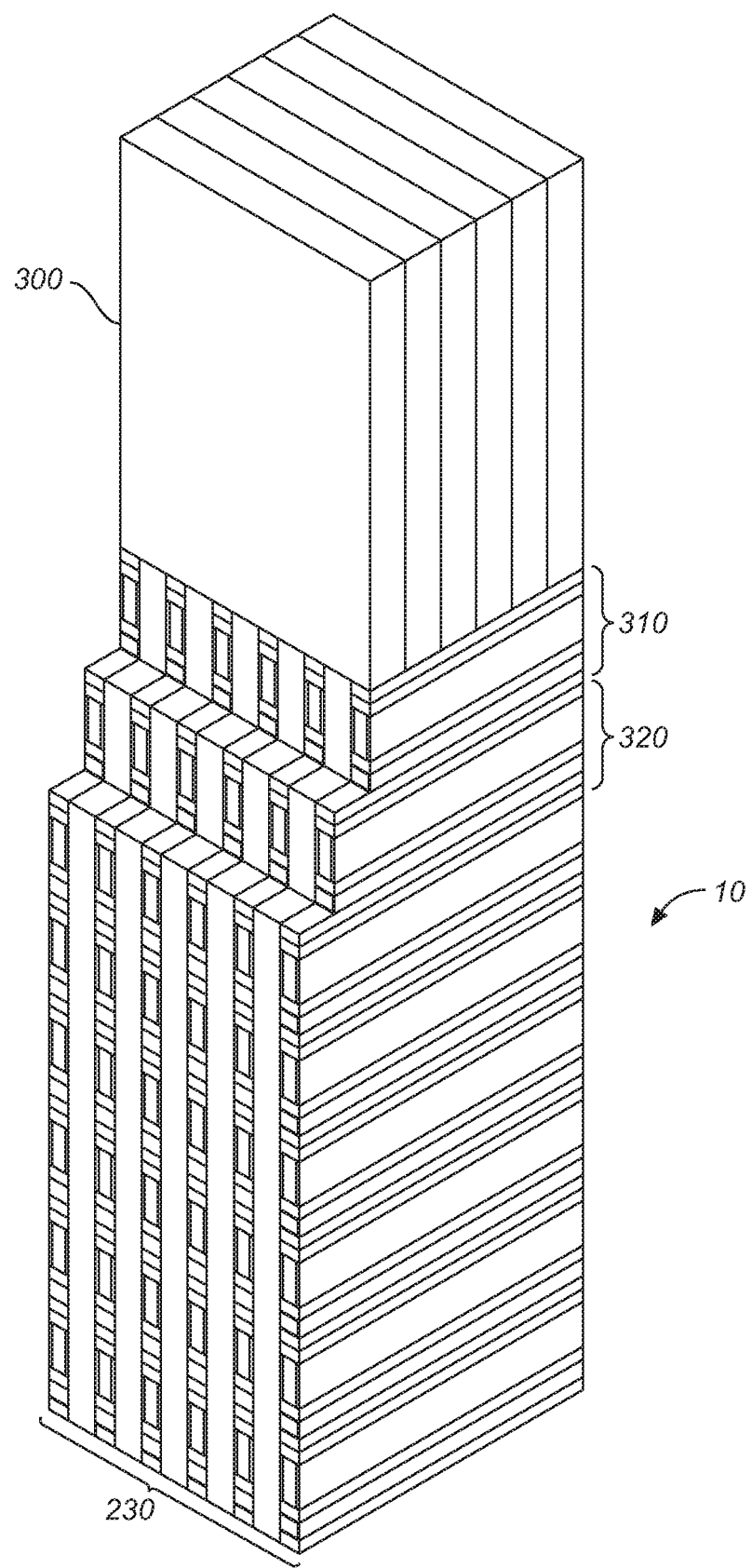
Figure 23:
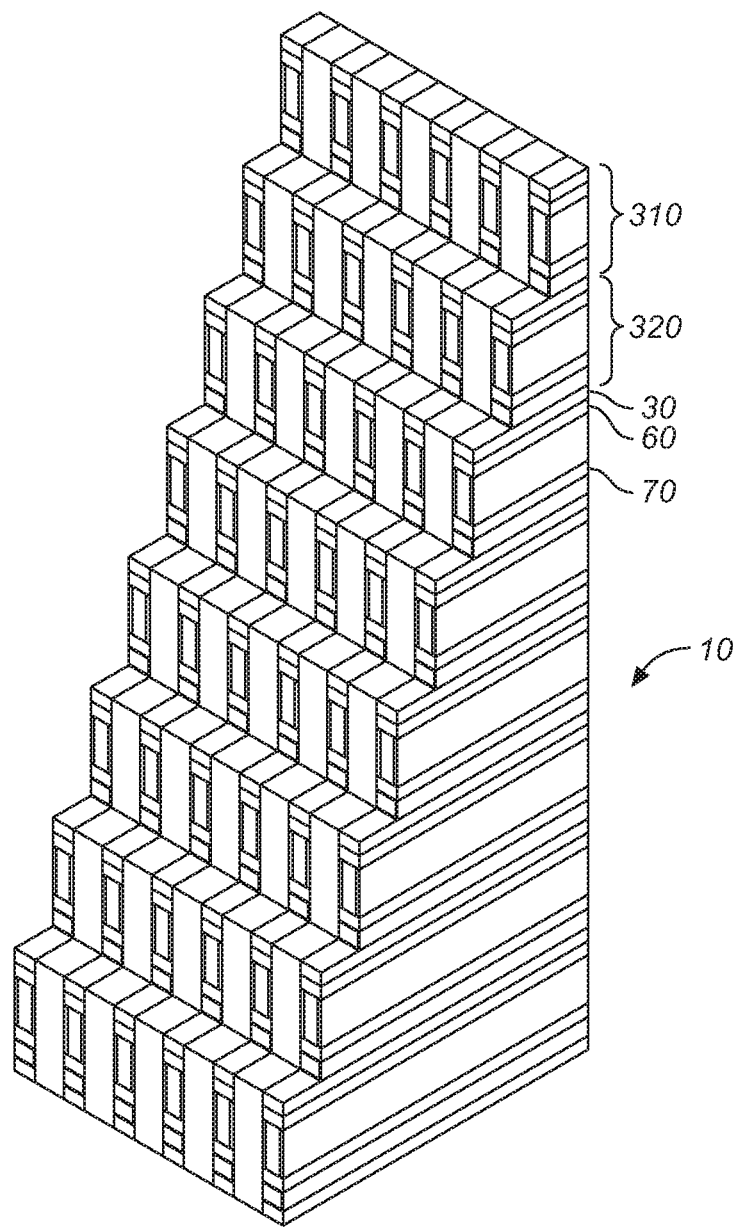
Figure 24:
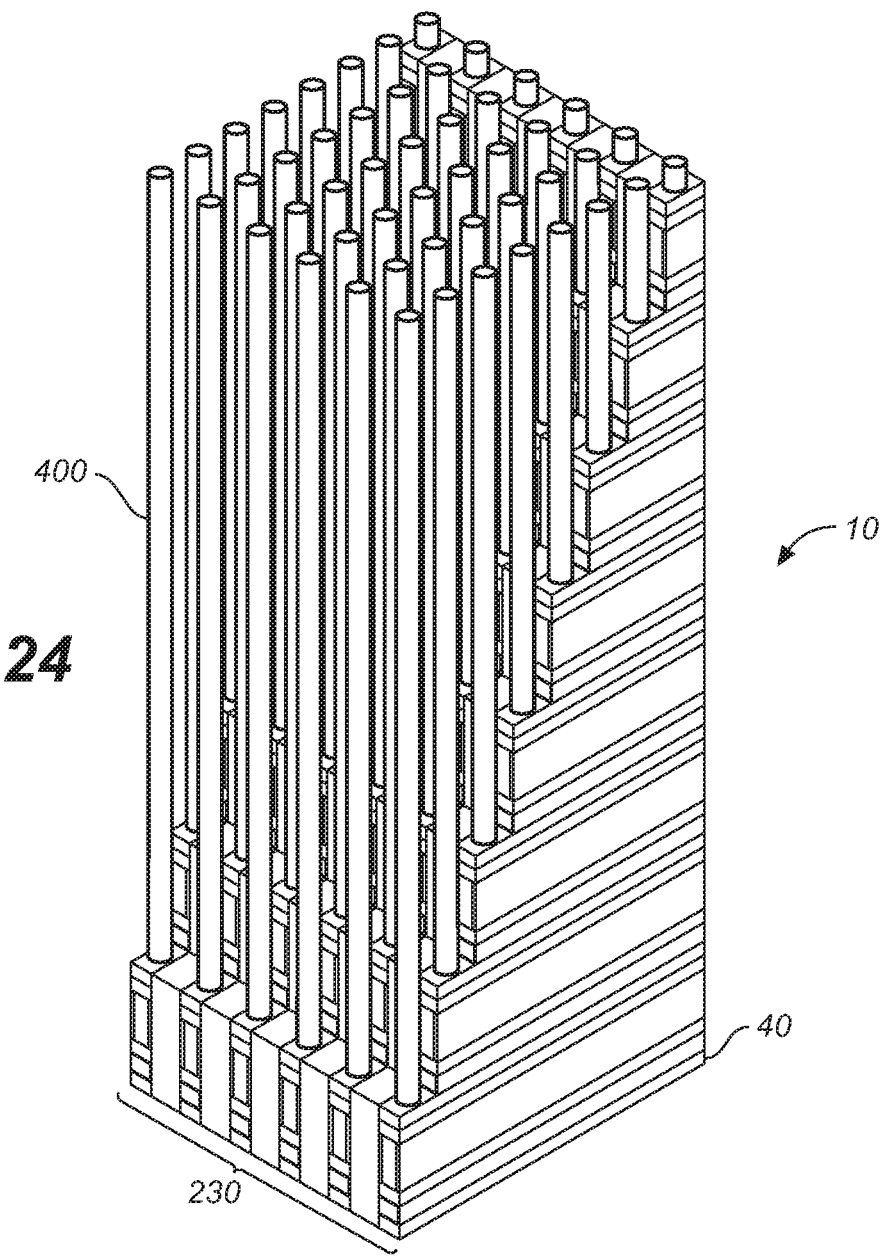

Connections to the bit lines are made by a "staircase" method. In a staircase structure, active strips in an active stack are cut to successively greater lengths to allow vertical conductors to contact the drain layers of successive active strips at the steps. Examples of such methods are disclosed, for example, in Provisional application IV incorporated by reference above. FIG. 21 shows deposited and patterned masking layer 300 being provided over memory structure 10, with a portion of an active layer (indicated by reference numeral 310) removed at one or both ends along its length. (FIG. 21 also shows a step is formed by cutting the top active strip of active stack 170; note that memory structure 10 in FIG. 21 is viewed 90° from the view of FIG. 20 and showing only an end portion along the length of the active strips). Using a photoresist recess technique discussed, for example, in Provisional application IV, masking layer 300 is recessed from one or both ends without an additional photo-lithographical step to expose portions of active layers 310 and 320 for an etching step to follow. The structure resulting from the etching step is shown in FIG. 22. The photoresist recessing and etching steps may be repeated until all active layers, except the lowest active layer, have been etched to form a staircase structure; the structure resulting from the repeated steps is shown in FIG. 23. The staircase structure exposes source 60 or drain layer 70 in each of the successive active layers. A dielectric material is then deposited over the staircase structure and planarized by CMP. FIG. 24 shows that the result dielectric material is patterned and etched for via openings, which are then and then filled with a conductive material (e.g., a refractory metal, such as tungsten) 400 to provide contacts to the ends of source layer 60 or drain layer 70 (i.e., the bit line) in each active layer exposed by the staircase structure. In this manner, each bit line is connected to selective circuitry (e.g., a decoder and a sense amplifier) in the semiconductor substrate, or on a separate companion integrated circuit. Such an integrated circuit may be connected to circuitry in the semiconductor substrate using a flip-wafer technique (e.g., through a multitude of miniature copper studs between connected wafers) known in the art.

According to a second embodiment of the present invention, as illustrated in FIGS. 25-36, a single etching step is used to etch the active layers into the active stacks of a HNOR memory array to avoid misalignment. To provide mechanical support, dielectric pillars are formed prior to etching the active layers to create the active stacks. These pillars lend support to the subsequently formed active stacks by maintaining their structural stability. Suitable choice of feature aspect ratios avoids ribboning during the high aspect ratio etch steps.

Figure 25:
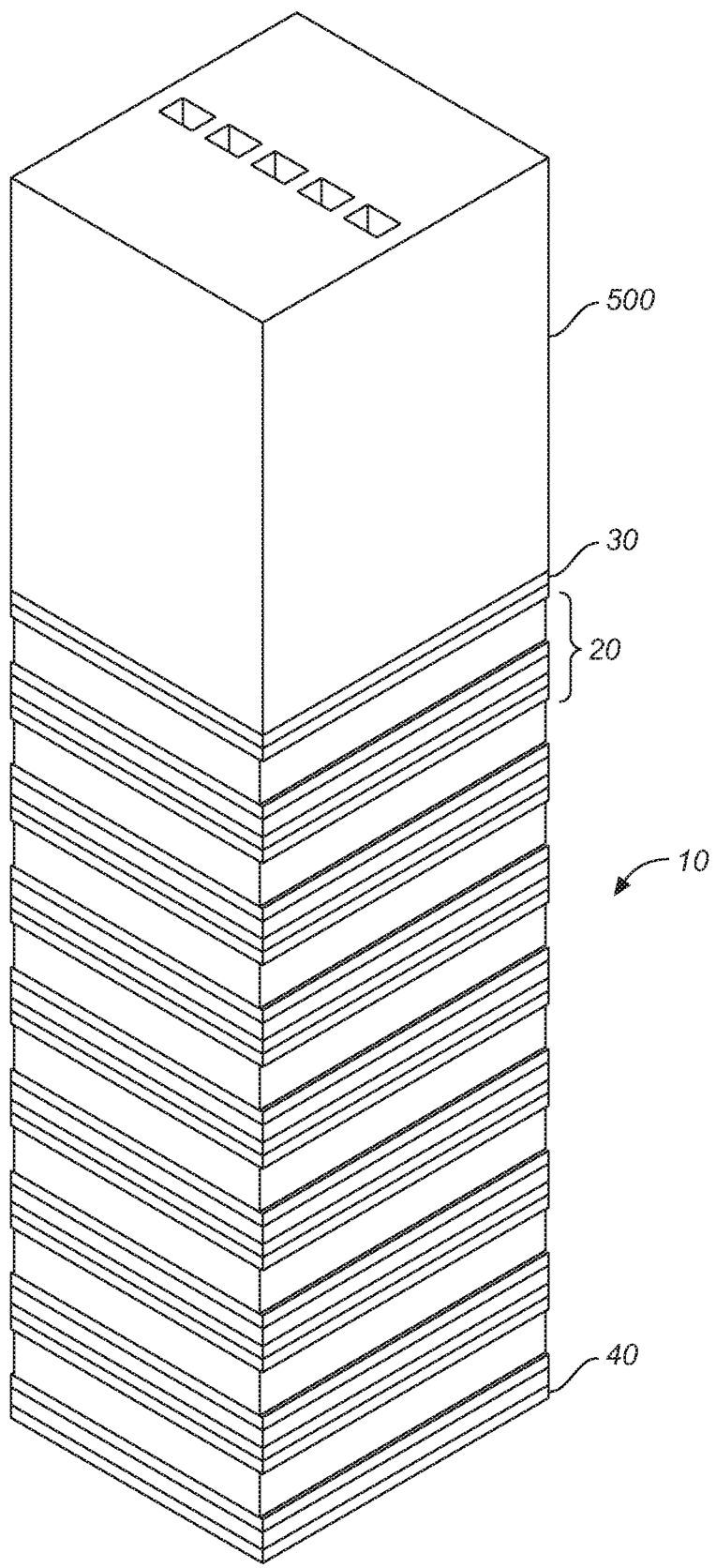
FIGS. 25, 26, 27, 28, 29, 30, 31, 32, 33, 34, 35 and 36 illustrate formation of an HNOR memory array using a single etching step to etch a set of active layers into the active stacks of the HNOR memory array, according to a second embodiment of the present invention.
Figure 26:
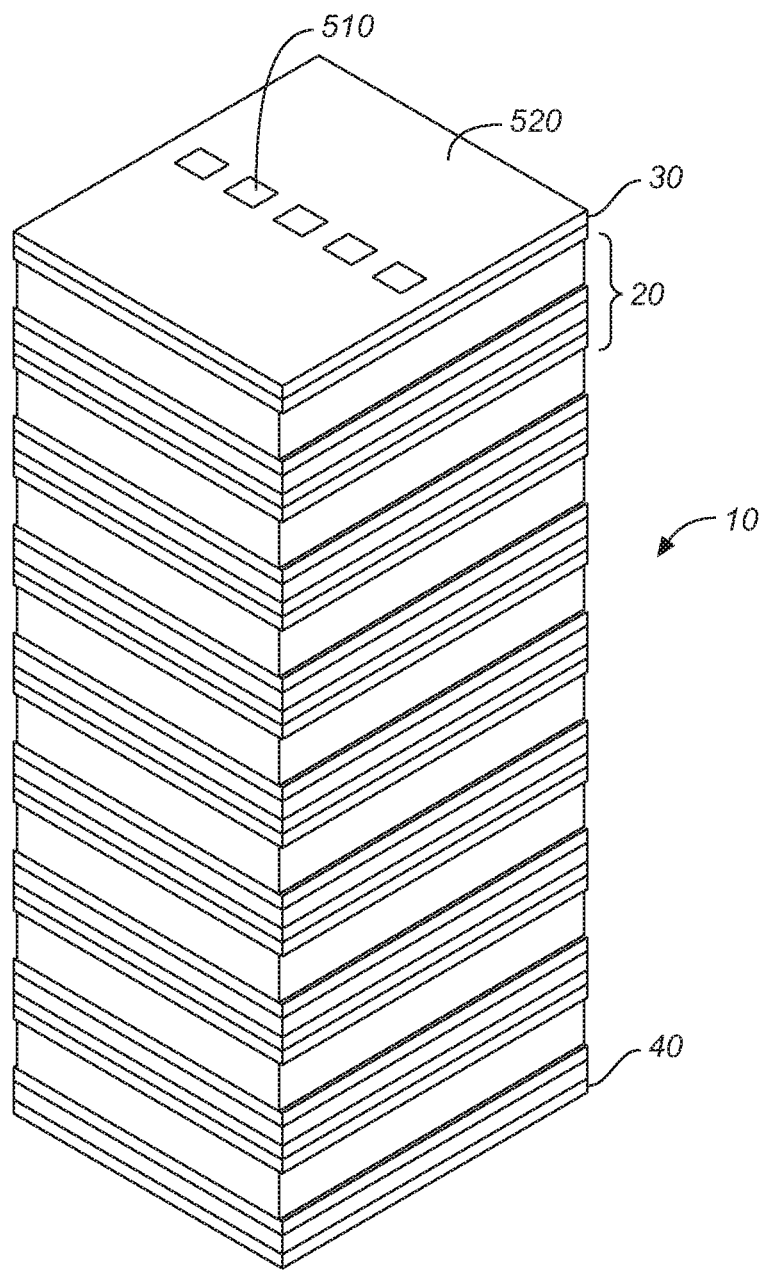

FIG. 25 shows memory structure 10 including eight active layers (e.g., active layer 20) between hard mask layer 30 and etch-stop layer 40, as in FIG. 1. The constituent layers of each active layer may be the same as those active layers discussed in conjunction with FIG. 1. Masking structure 500 allows memory structure 10 to be patterned and etched to etch-stop layer 40 to provide a set of vias 505 (not shown). After masking structure 500 is removed, vias 505 are filled with dielectric material, thus forming dielectric pillars 510, which are shown in FIG. 26. Dielectric pillars 510 may include any suitable dielectric material (e.g., $SiO_2$, SiN, SiON, SiCOH), which may be deposited using any suitable method, such as LPCVD, ALD, or high density plasma CVD ("HDP CVD"). After deposition, the dielectric material on top surface 520 of memory structure 10 may be removed using any suitable planarization technique, such as CMP or etch-back.

Figure 27:
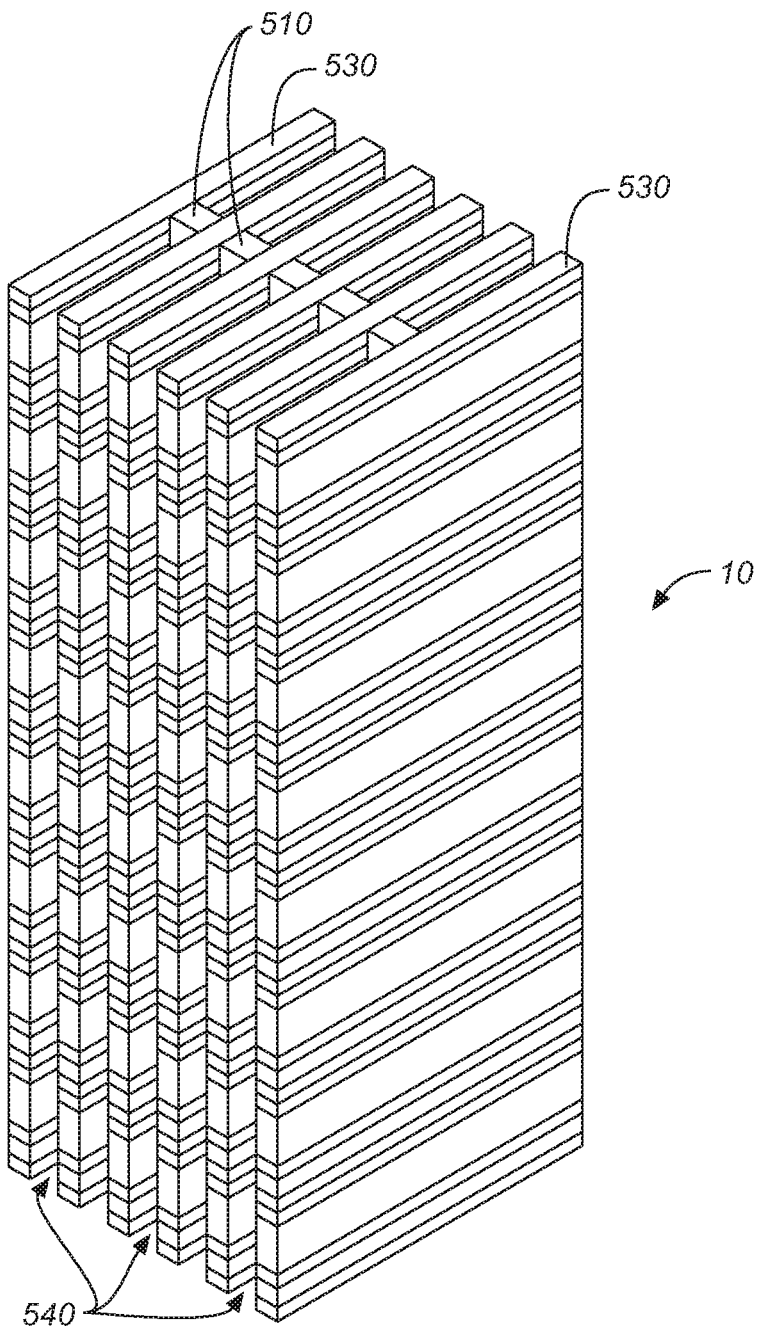
Figure 28:
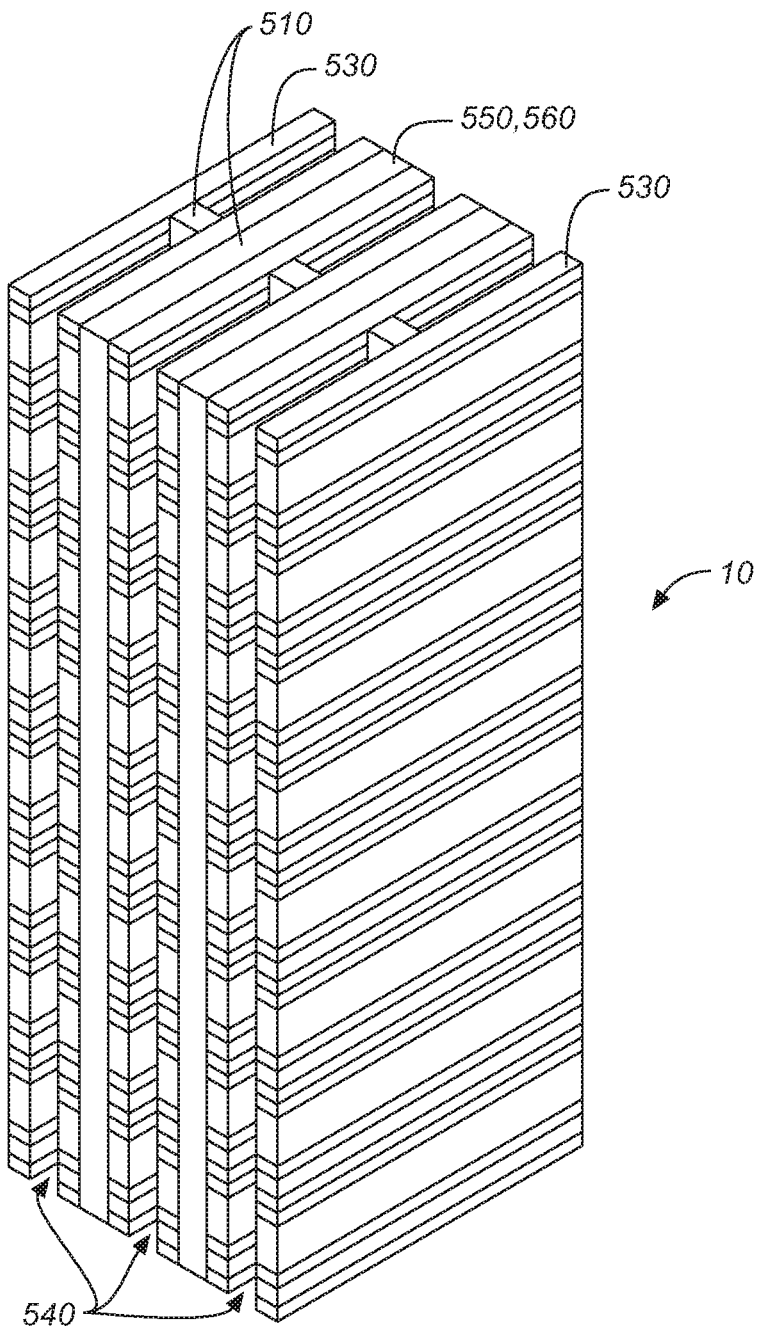

Thereafter, as shown FIG. 27, memory structure 10 is patterned and etched into active stacks 530, cutting trenches 540 between the active steps. The etching step leaves dielectric pillars 510 intact to allow these pillars to provide structural integrity and mechanical strength to active stacks 530 in formation. Dielectric material layers 550 and 560, like dielectric layers 130 and 140 in trenches 110 and 160 discussed above, may then be deposited into the trenches 540, filling the trenches 540. A masking layer (not shown) is then applied and patterned to protect active stacks 530 and one half of filled trenches 540. The exposed ones of trenches 540 are then etched to remove dielectric material layers 550 and 560, but without etching dielectric pillars 510. The resulting structure is shown in FIG. 29.

Figure 29:
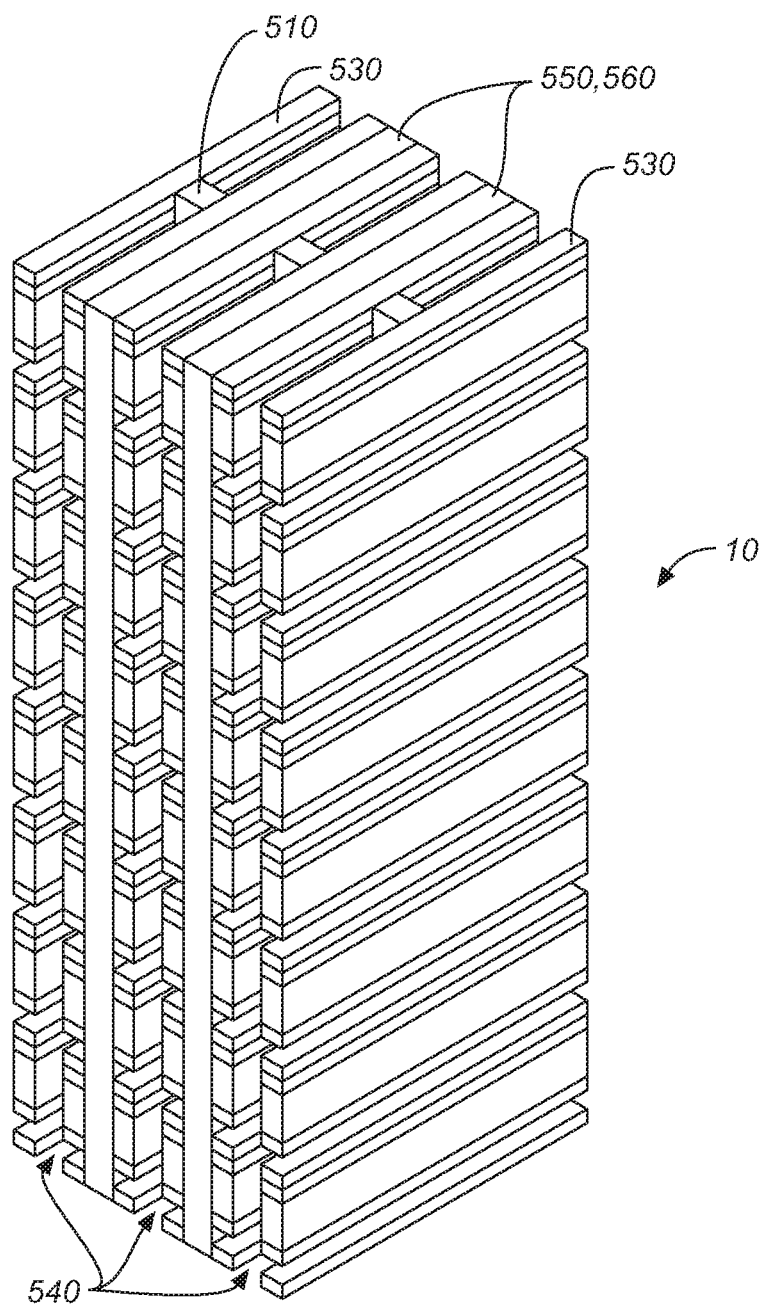
Figure 30:
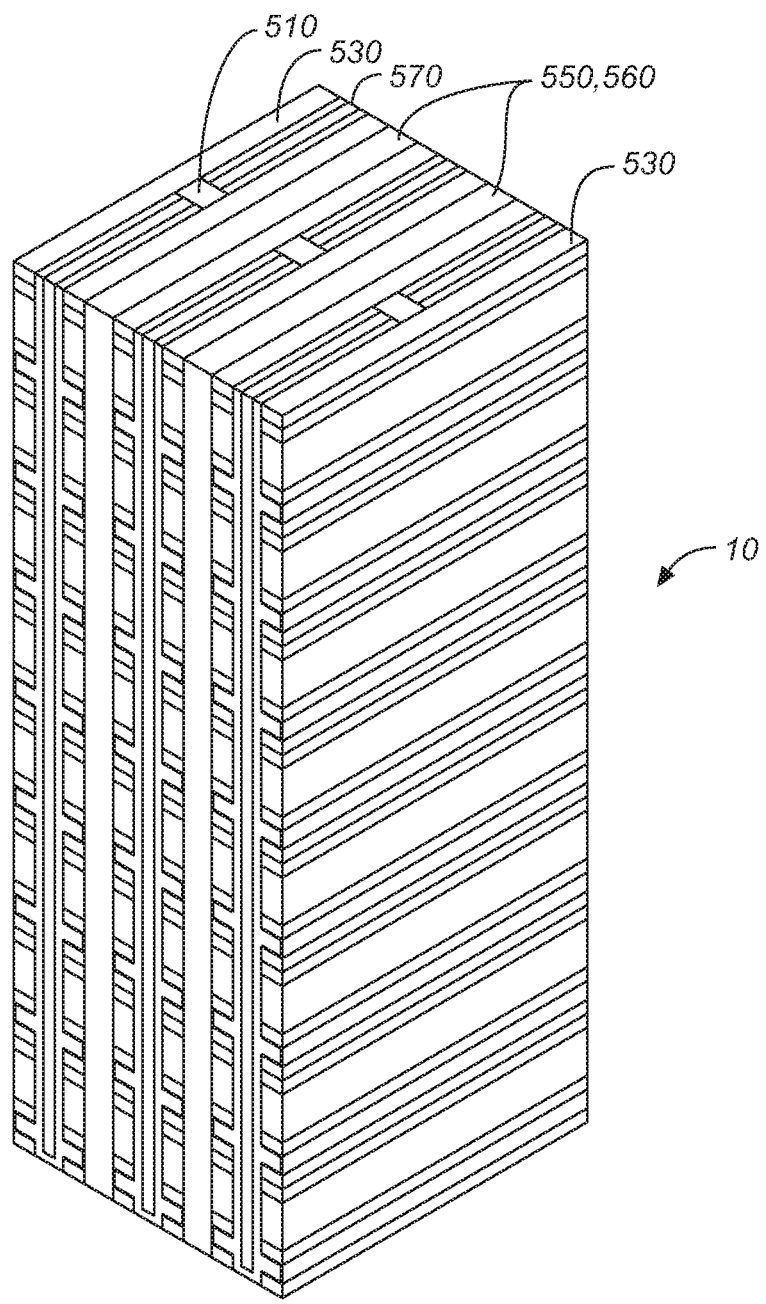
Figure 31:
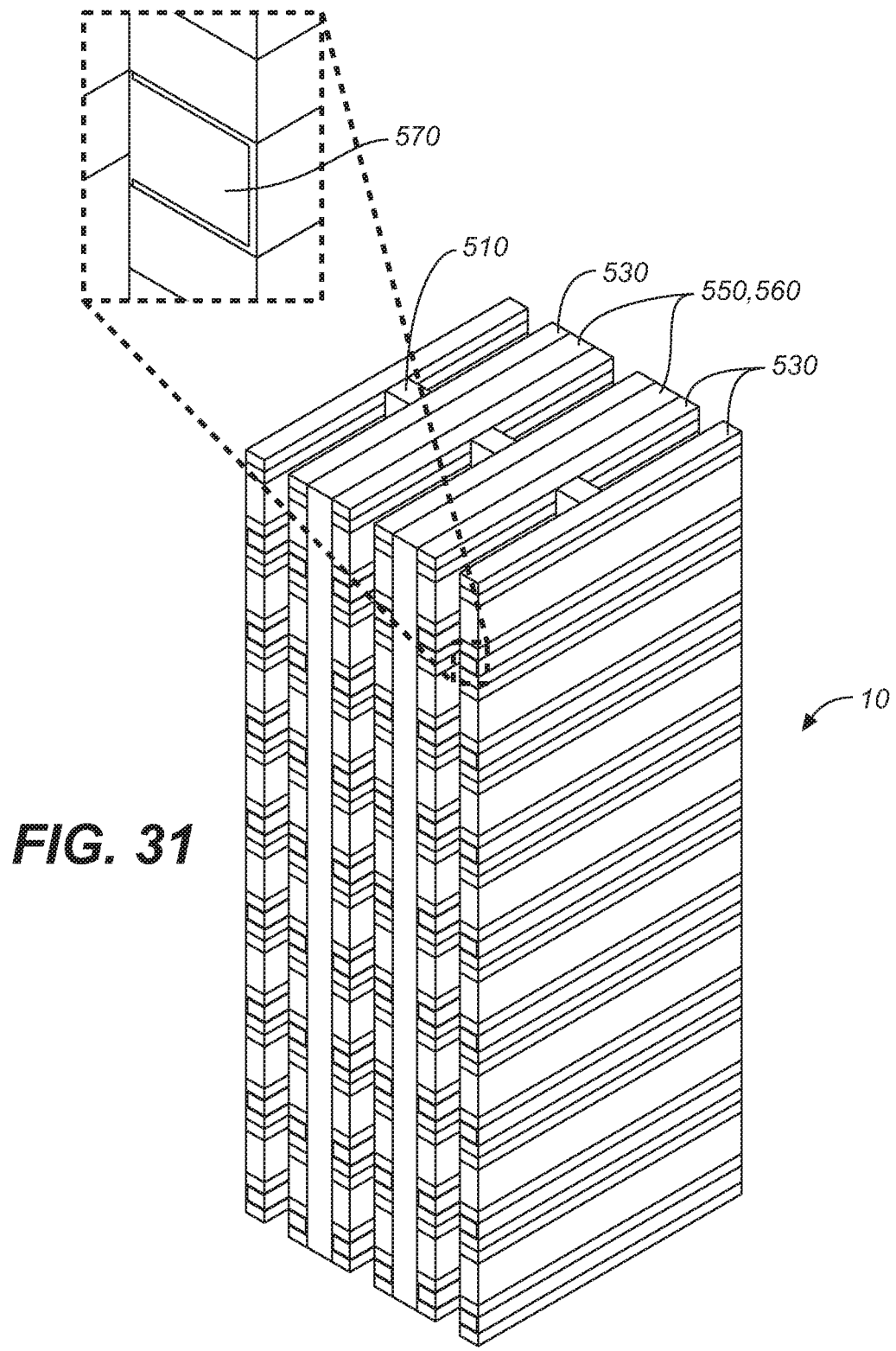

Referring to FIG. 29, SAC4 layer 80 in each active layer of active stacks 530 may then be removed by a selective etch. Metal layers 570 are deposited to partially fill the excavated trenches 540 and in place of the removed SAC4 layer 80, as shown in FIG. 30. Referring to FIG. 31, portions of metal layers 570 are then removed by a selective anisotropic etch from trenches 540, leaving the portions of metal layers 570 which replaced the SAC4 layer 80 of each active strip.

Figure 32:
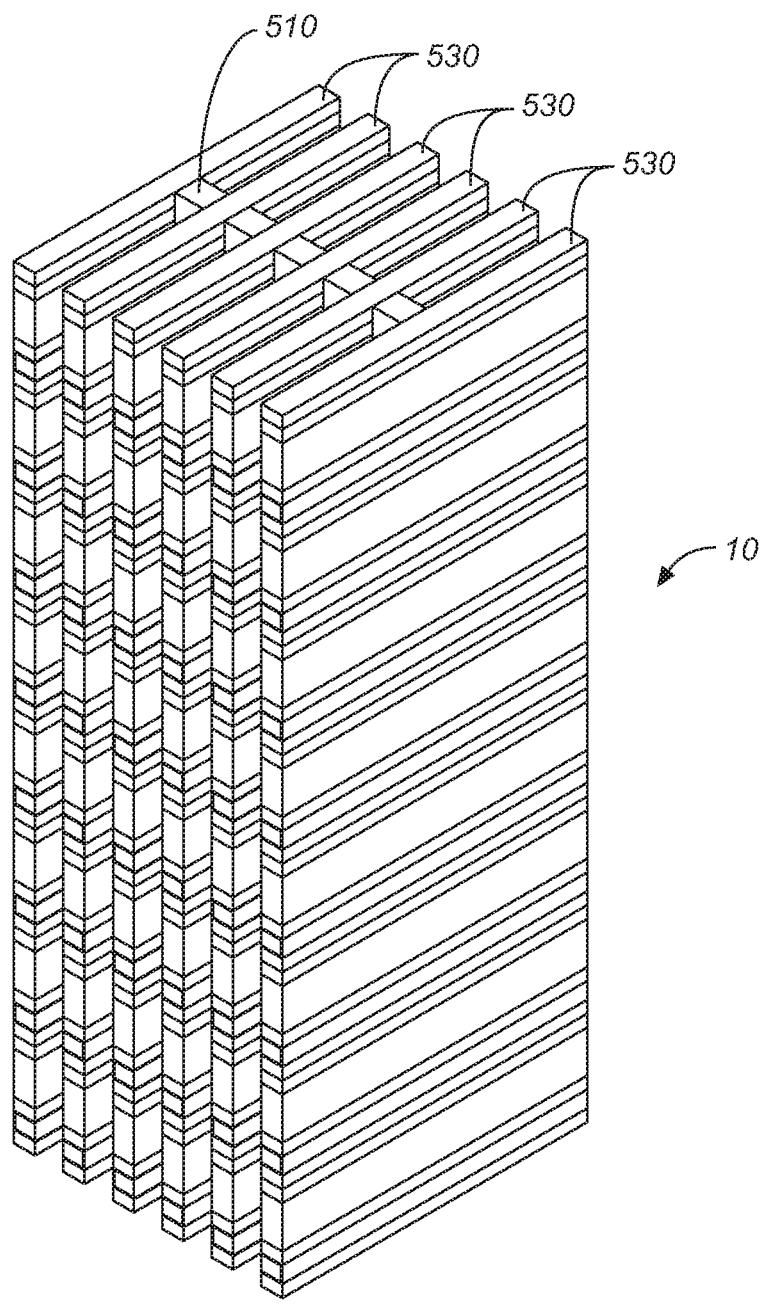
Figure 33:
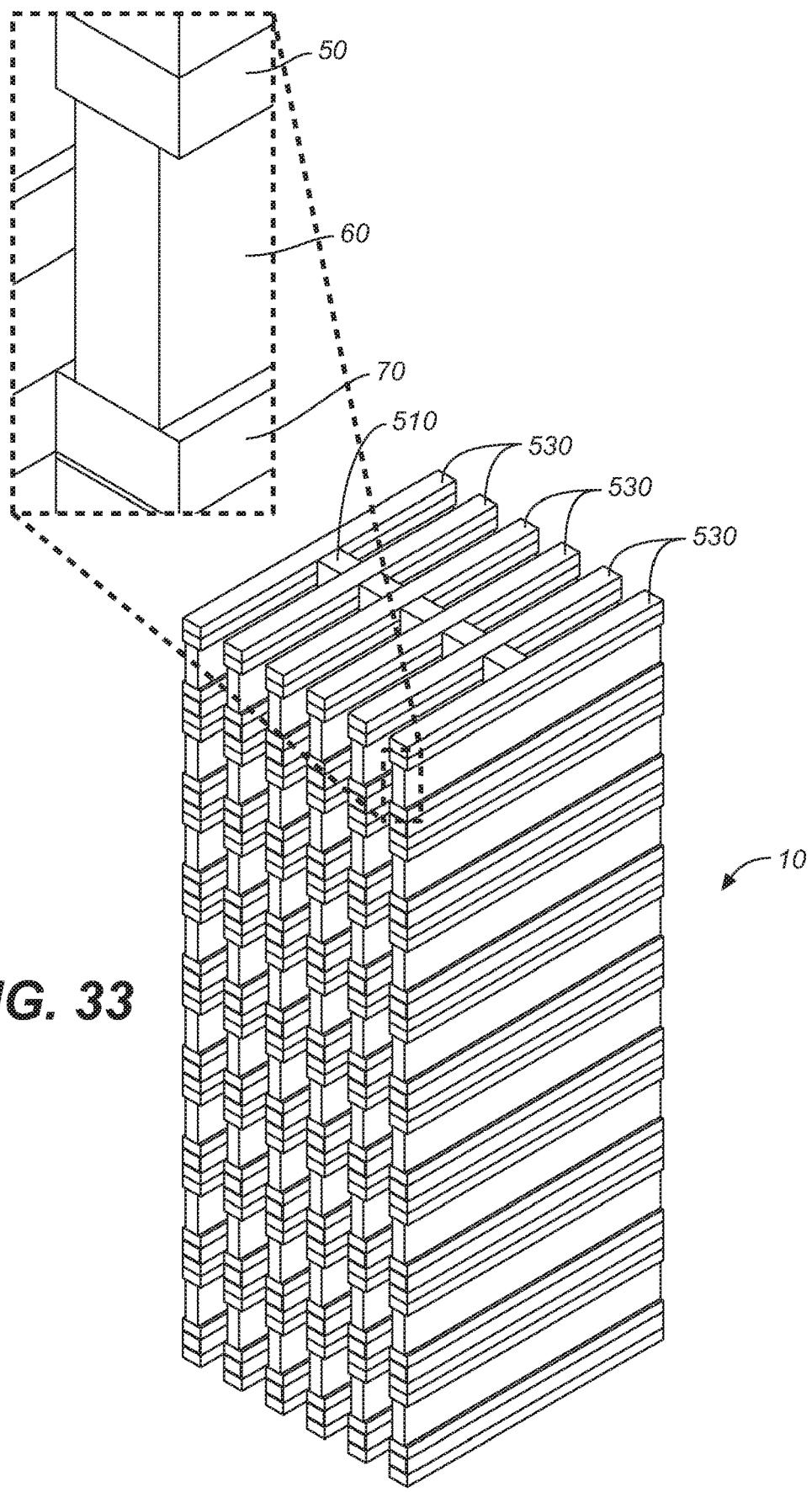
Figure 34:
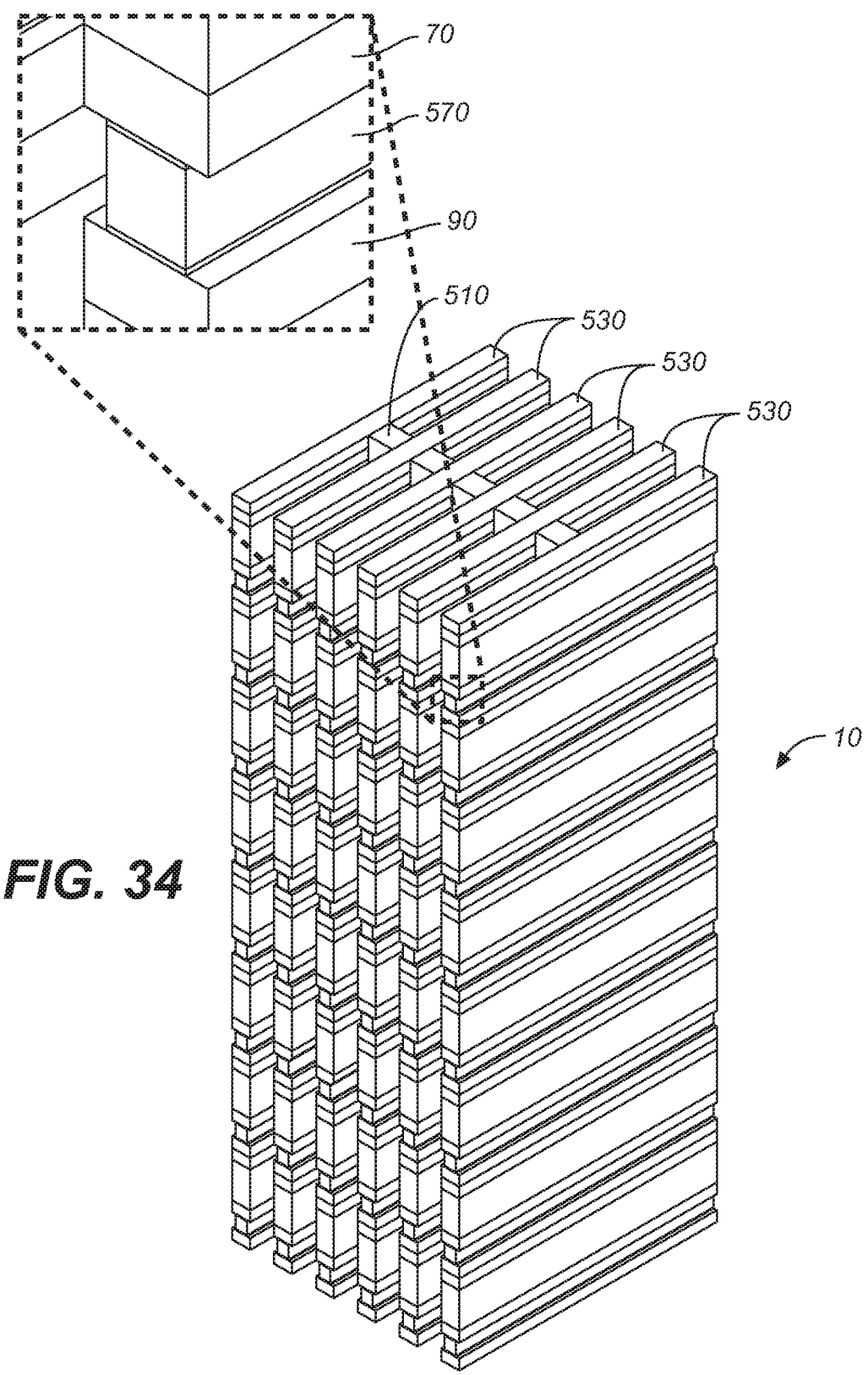

Thereafter, the remaining dielectric layers 550 and 560 are removed from filled trenches 540 everywhere by a selective etch, leaving active stacks 530 and dielectric pillars 510, as shown in FIG. 32. Referring to FIG. 33, portions of SAC1 layer 60 of each active strip are then recessed by a selective etch. This selective etch does not require a masking layer. In addition, as shown in FIG. 34, portions of metal layer 570 of each active layer are also recessed by a selective etch, also without a masking layer, to shape metal layer 570 of each active strip into an elongated metal strip with recessed faces to trenches 540.

Figure 35:
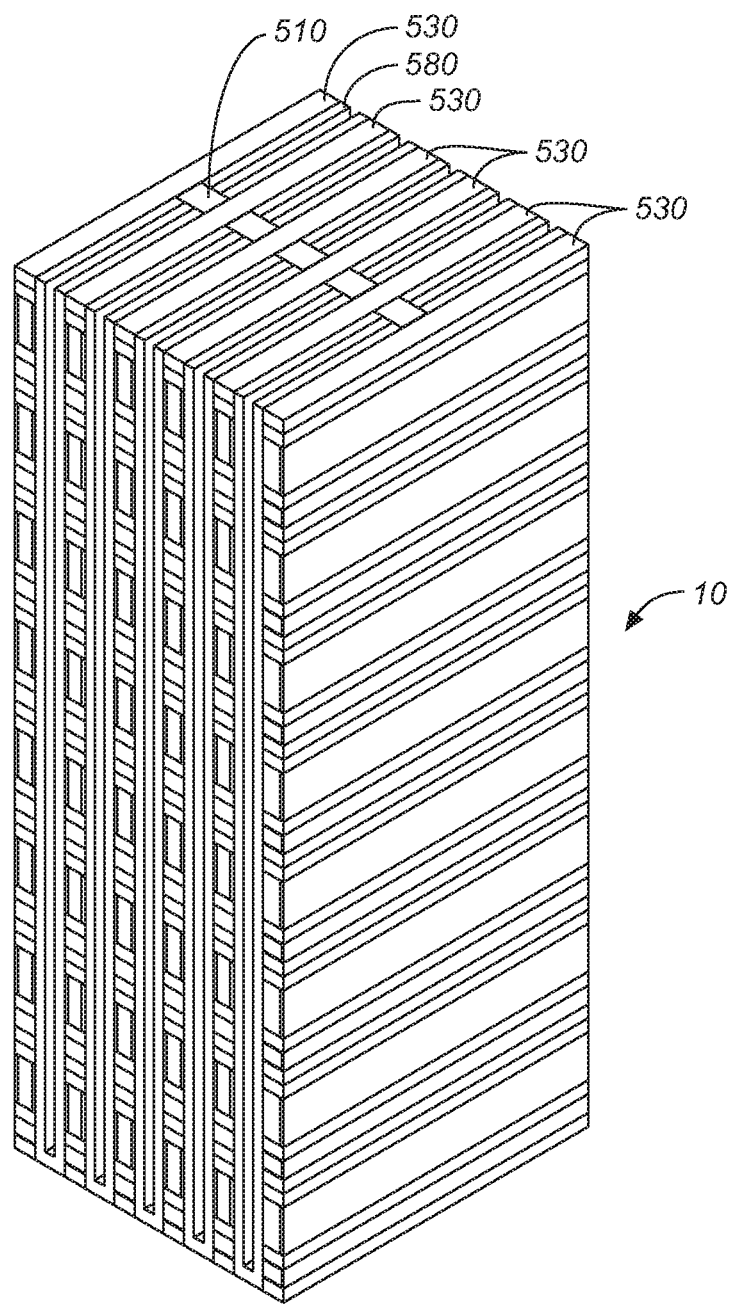
Figure 36:
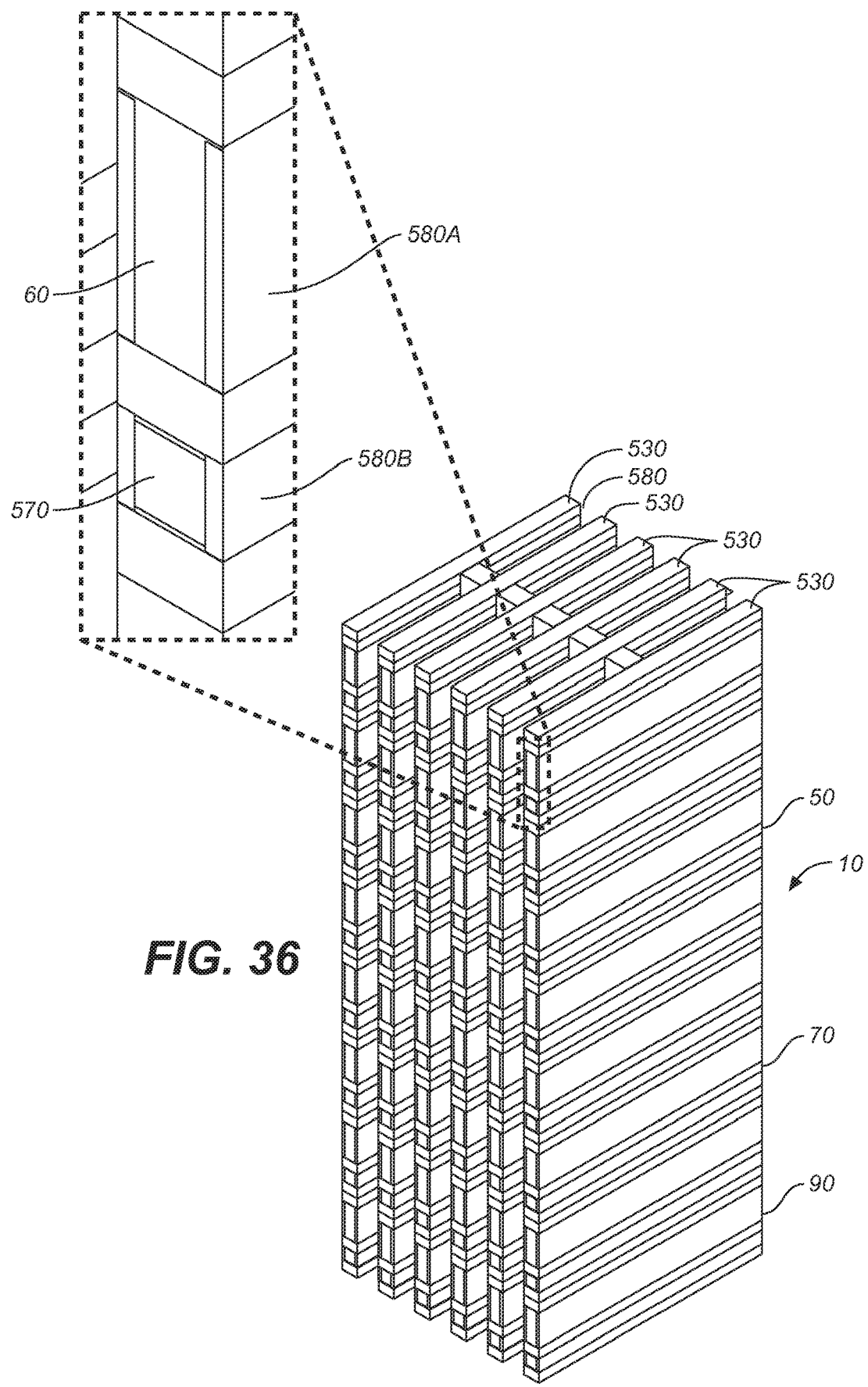

Semiconductor layer 580 is then deposited. As shown in FIG. 35, semiconductor layer 580 partially fills trenches 540 and fills the recessed cavities 580A and 580B, where the portions of SAC1 layer 60 and the portions of metal layer 570 of each active strip have been removed, respectively. Portions of semiconductor layer 580 are then removed by a selective anisotropic etch, as shown in FIG. 36. Semiconductor layer 580A forms the channel region of a thin-film transistor to be formed, while semiconductor layer 580B clads metal layer 570, which forms a bit line for the HNOR memory array to be formed from memory structure 10. Semiconductor layer 580B minimizes metal contamination of subsequent structures and eliminates direct contact between metal layer 570 and the charge trapping layer to be formed.

The remainder of the fabrication for memory structure 10 of FIG. 36 may proceed in the same manner as illustrated by FIGS. 17 to 24 above, with dielectric pillars 510 intact.

According to a third embodiment of the present invention, as illustrated in FIGS. 37-50, a method for forming the active stacks of an HNOR memory array in two etching steps is provided, which minimizes the chance of ribboning and which maintains structural stability. A method according to this third embodiment uses three masks of different properties to form the active strips: (i) a first mask that defines all the active strips at the same time, thereby avoiding misalignment between active strips; (ii) a second mask that is placed on top of the first mask and which defines a first half of the active strips; and (iii) a third mask that defines the remainder one half of the active strips, provided after the first and second masks have been removed.

Figure 37:
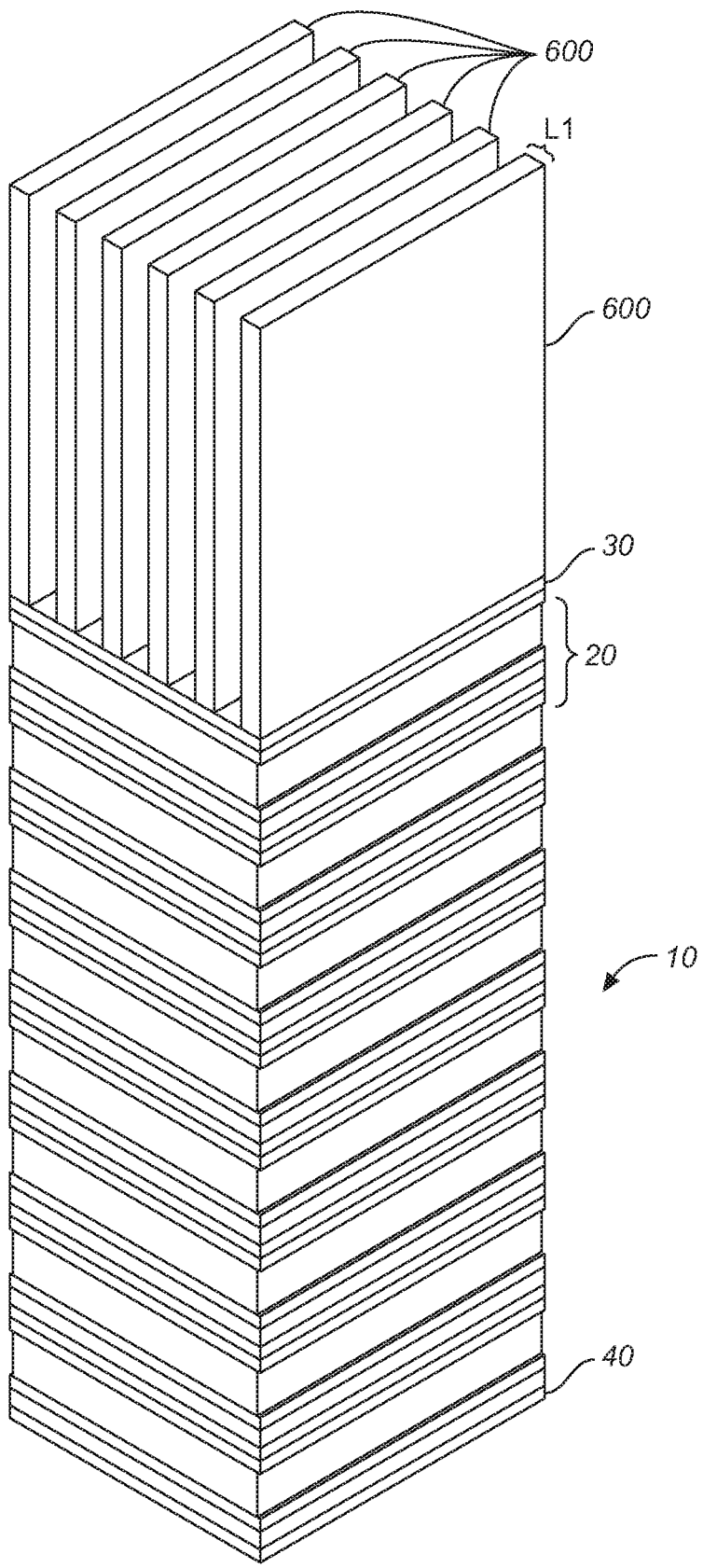
FIGS. 37, 38, 39, 40, 41, 42, 43, 44, 45, 46, 47, 48, 49 and 50 illustrate forming the active stacks of an HNOR memory array in two etching steps, according to a third embodiment of the present invention.
Figure 38:
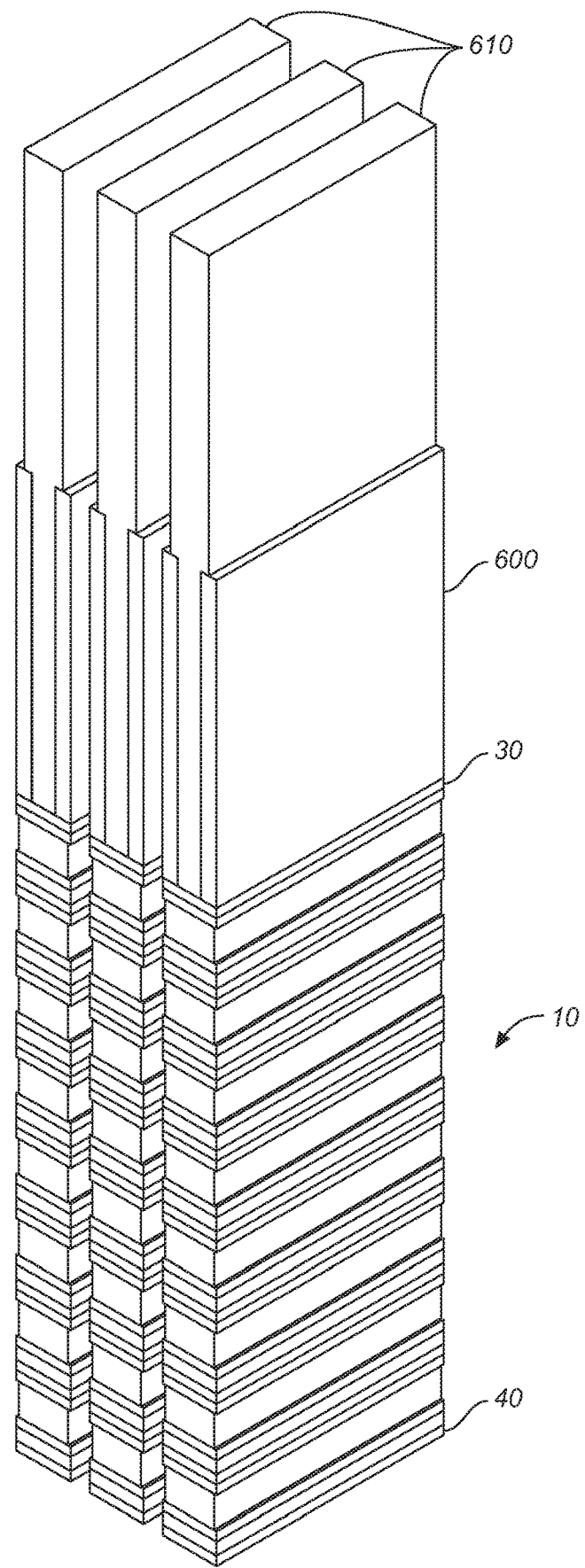

As shown in FIG. 37, memory structure 10 begins with eight active layers (e.g., active layer 20) between hard mask layer 30 and etch-stop layer 40. In FIG. 37, a first masking layer has been deposited and patterned to have masking structures 600 each of width $L_1$ representative of the desired width of each active strip in the active stack (see, e.g., FIG. 9 above). Thereafter, as illustrated in FIG. 38, a second masking layer with masking structures 610 is deposited and patterned to overlap masking structure 600, such that masking structures 610 occupies and protects every other space separating masking structures 600, taking into consideration layer-to-layer misalignment. The first and second masking layers have different etch properties and may include different materials.

Figure 39:
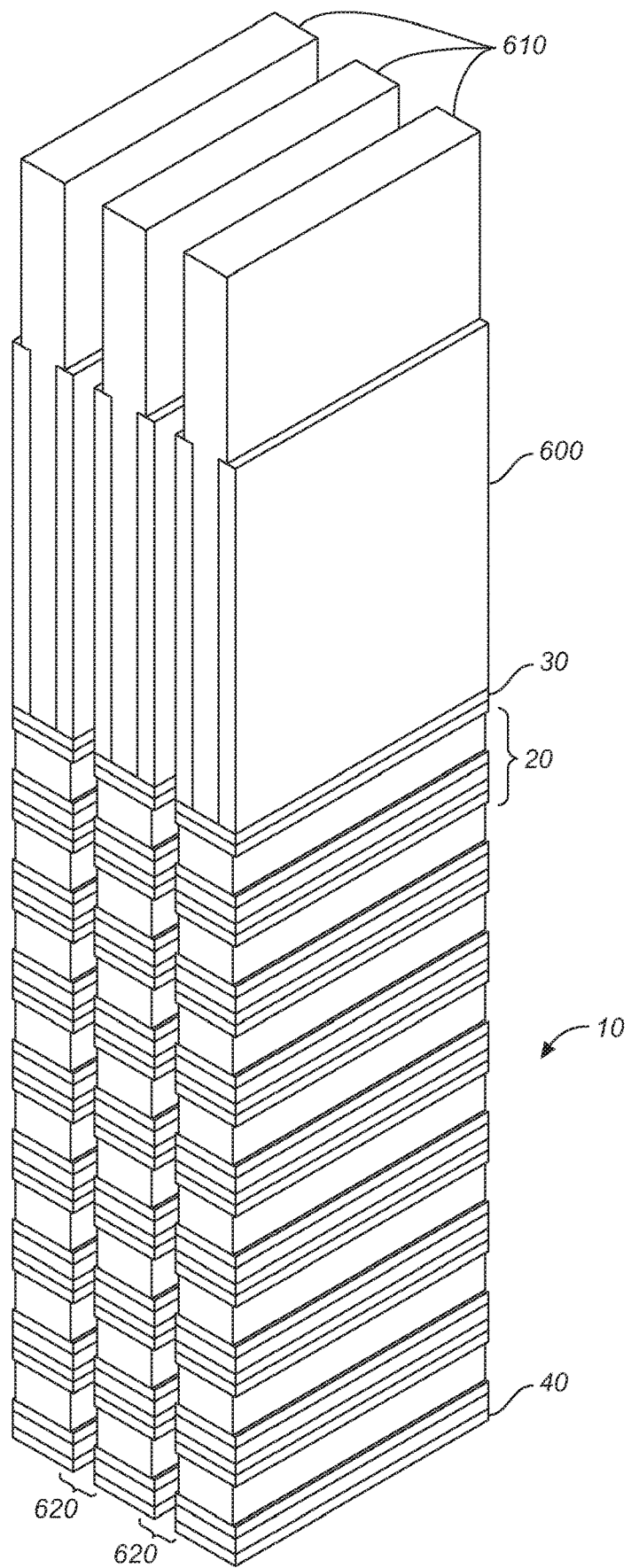
Figure 40:
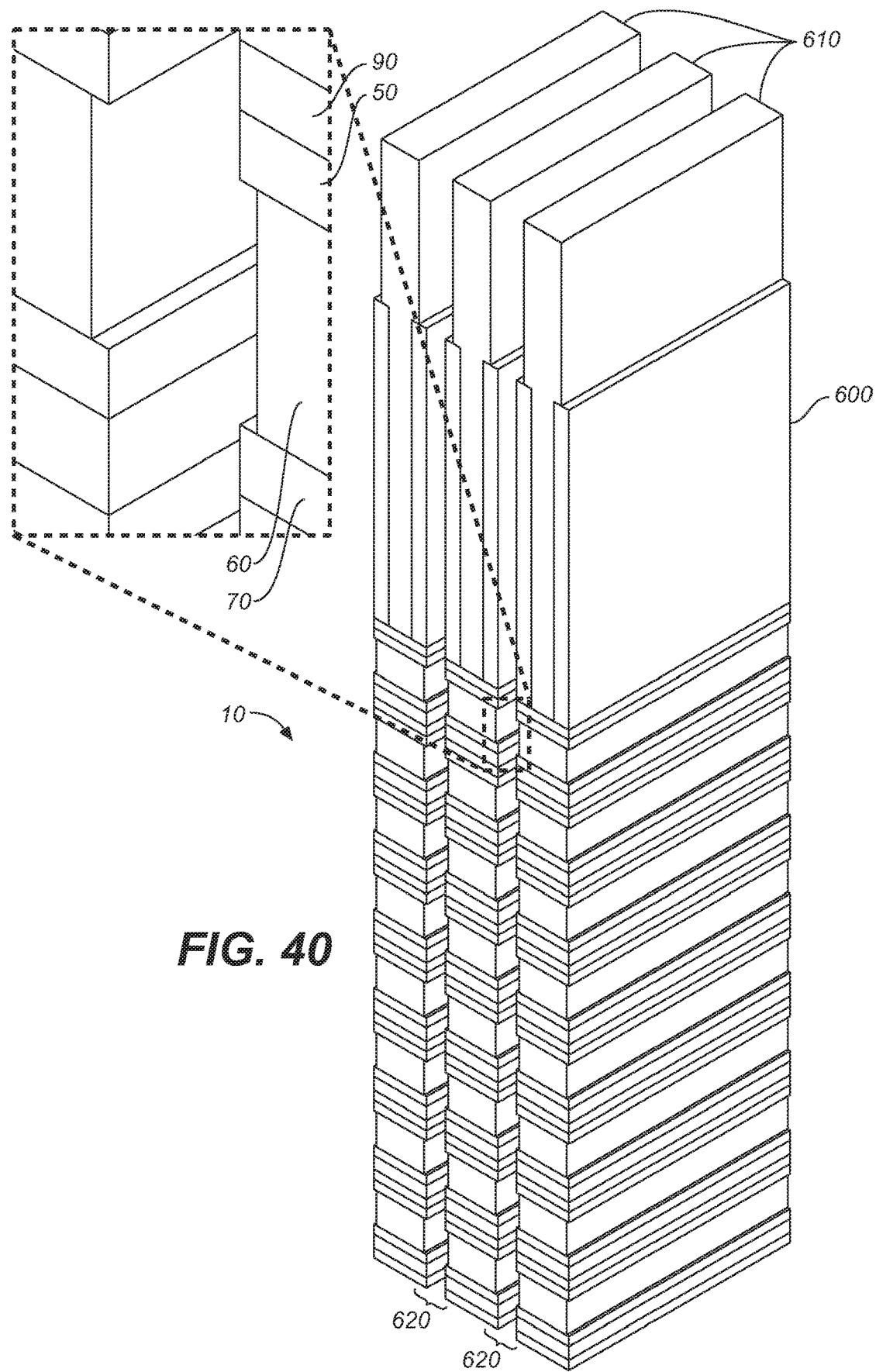
Figure 41:
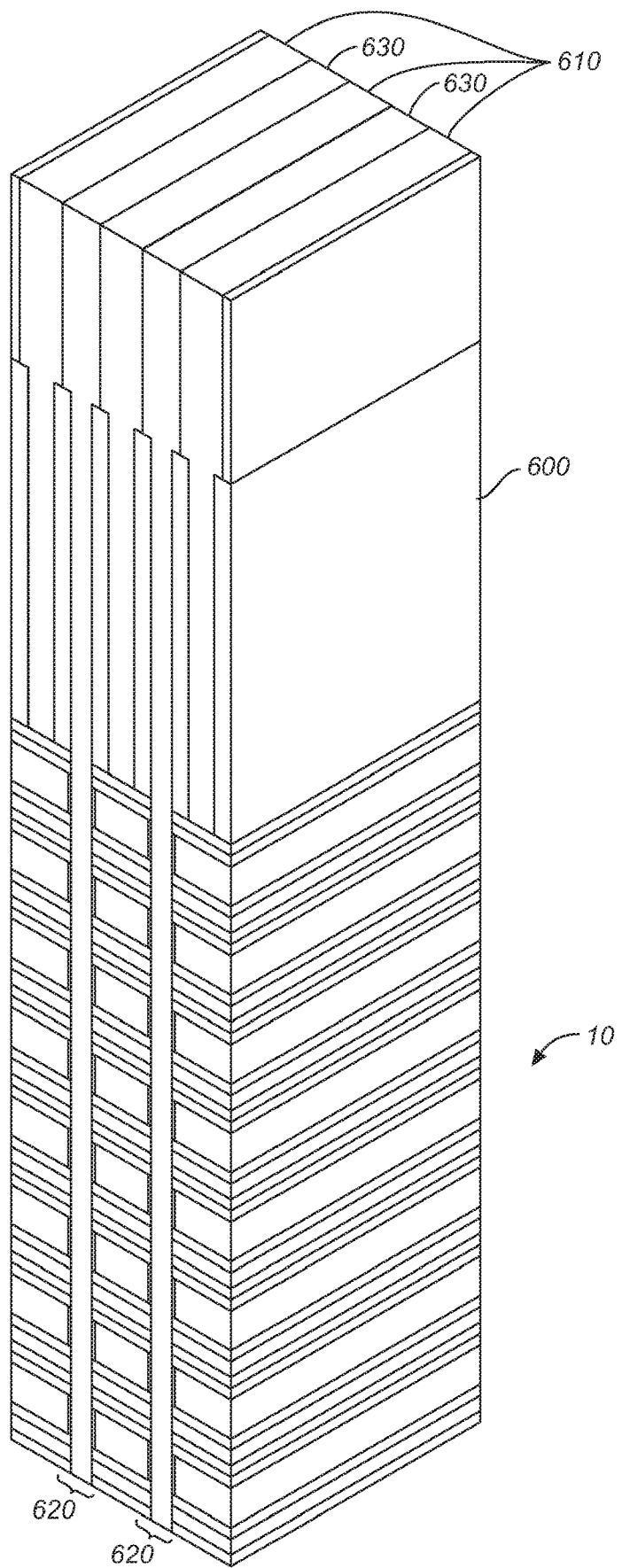
Figure 42:
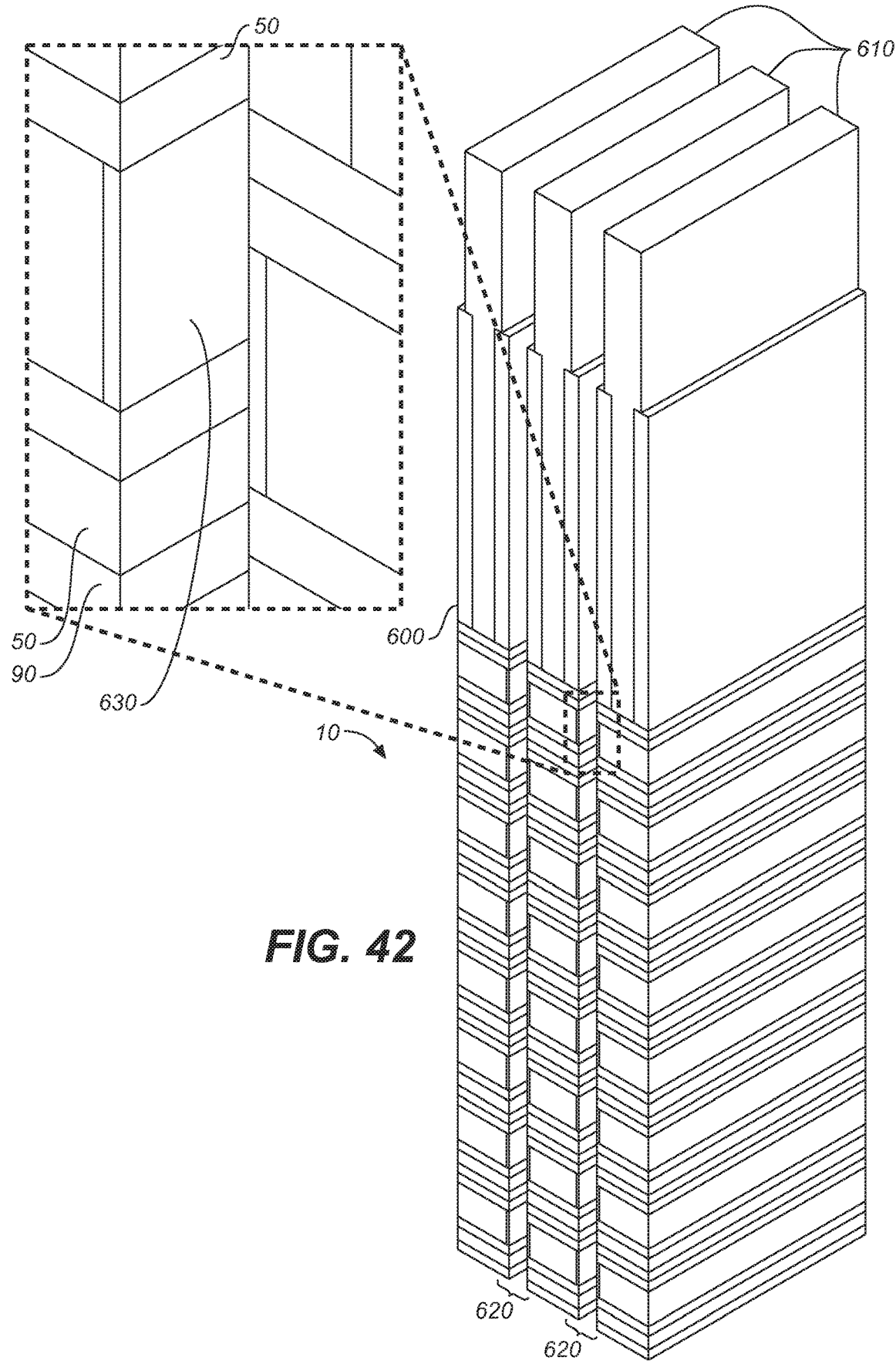

Referring to FIG. 39, trenches 620 through memory structure 10 are then etched. Referring to FIG. 40, portions of SAC1 layer 60 of each active layer exposed to trenches 620 are recessed by a selective etch to a predetermined depth (e.g., between 5 and 10 nanometers) with the mask structures 600 and 610 intact. Thereafter, as illustrated in FIG. 41, semiconductor layer 630 is then deposited, partially filling trenches 620 and the recessed cavities resulting from the removal of the portions of SAC1 layer 60 in each active strip, in substantially the same manner as semiconductor layer 120 discussed in conjunction with FIG. 5 above. Then, as illustrated in FIG. 42, the portions of semiconductor layer 630 along the sidewalls of trenches 620 are removed, leaving portions of semiconductor layer 630 in the recessed cavities.

Figure 43:
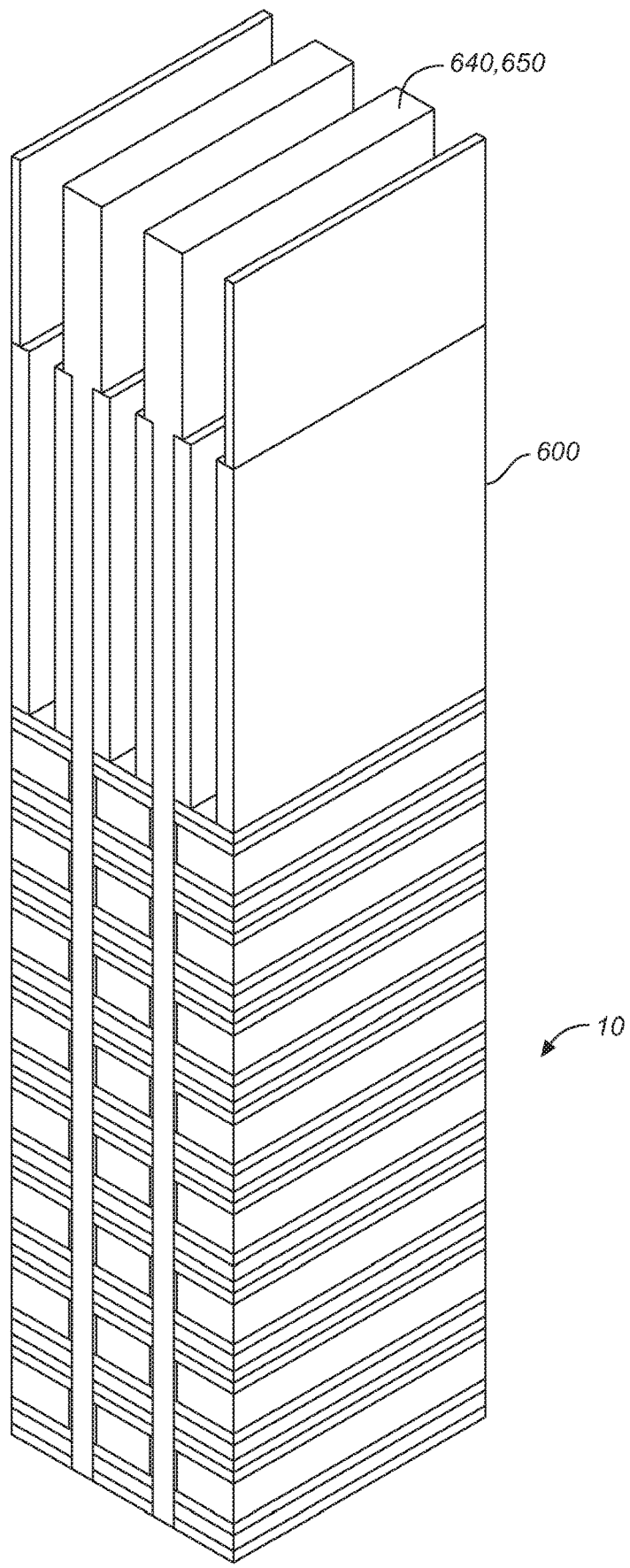
Figure 44:
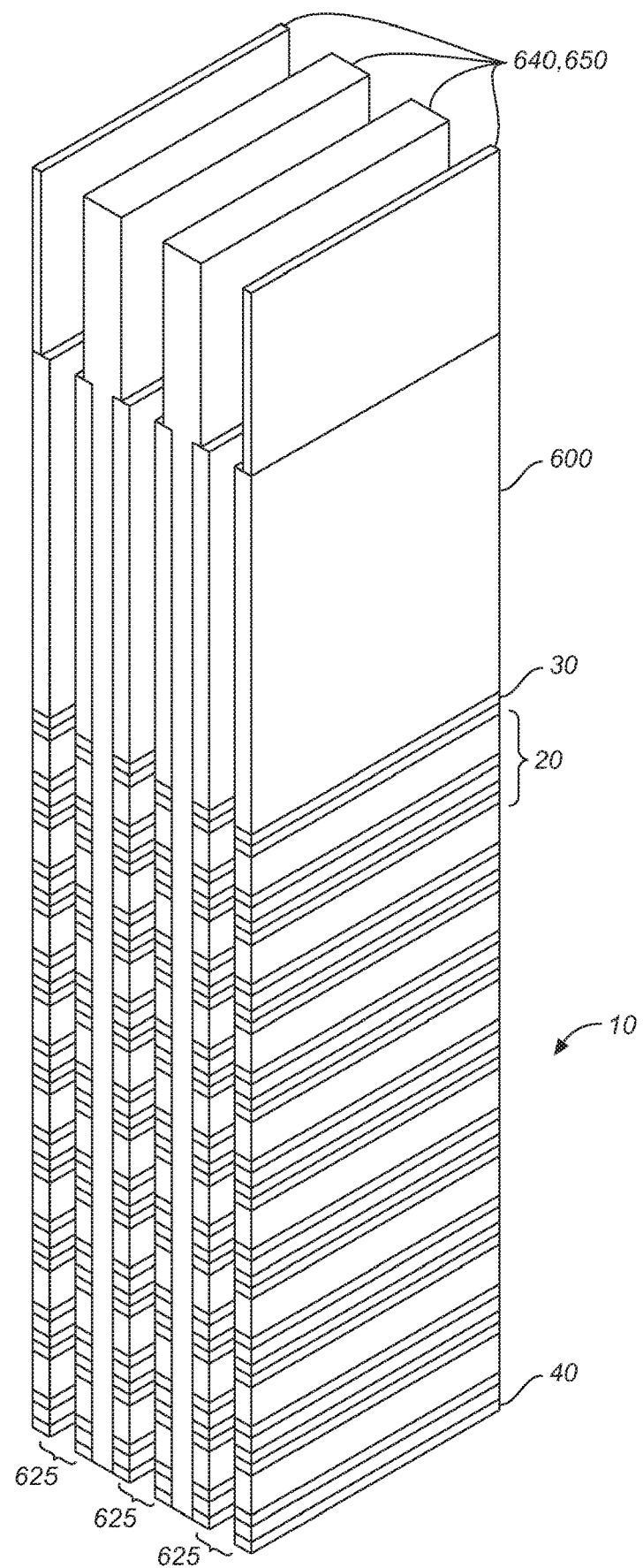
Figure 45:
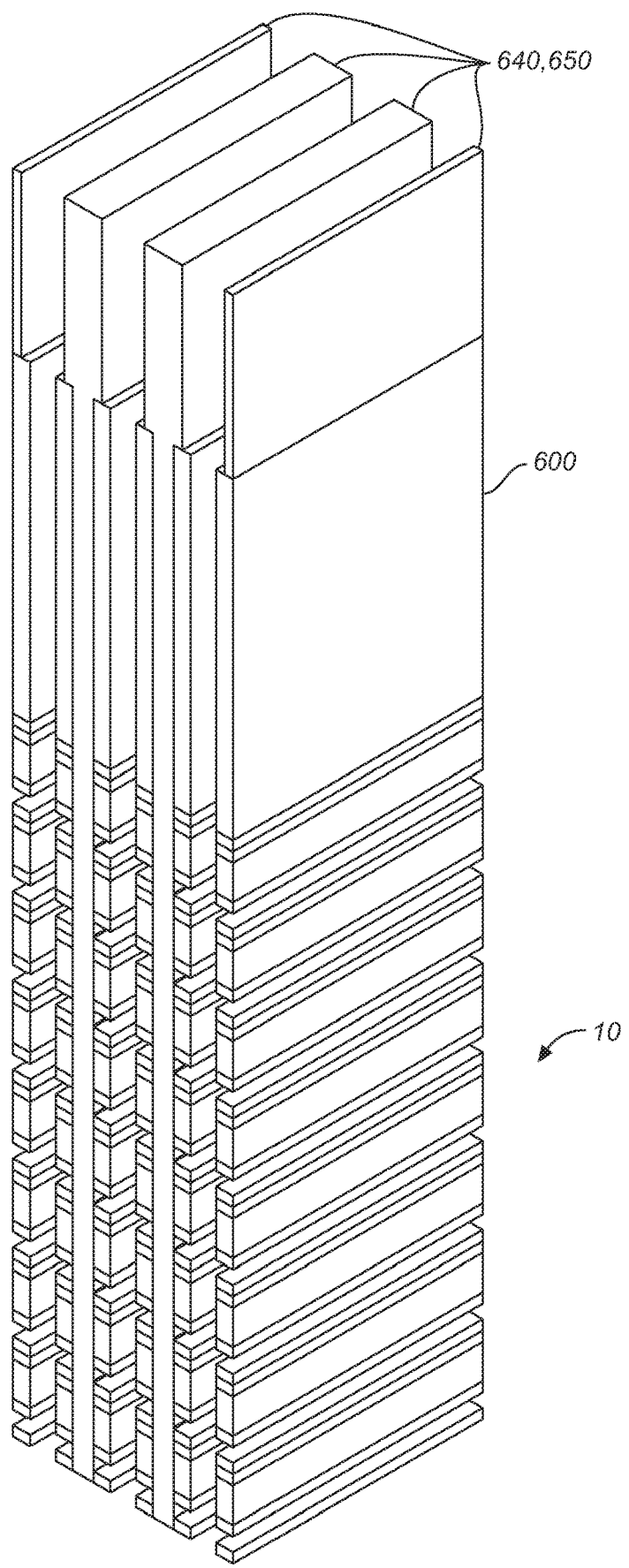
Figure 46:
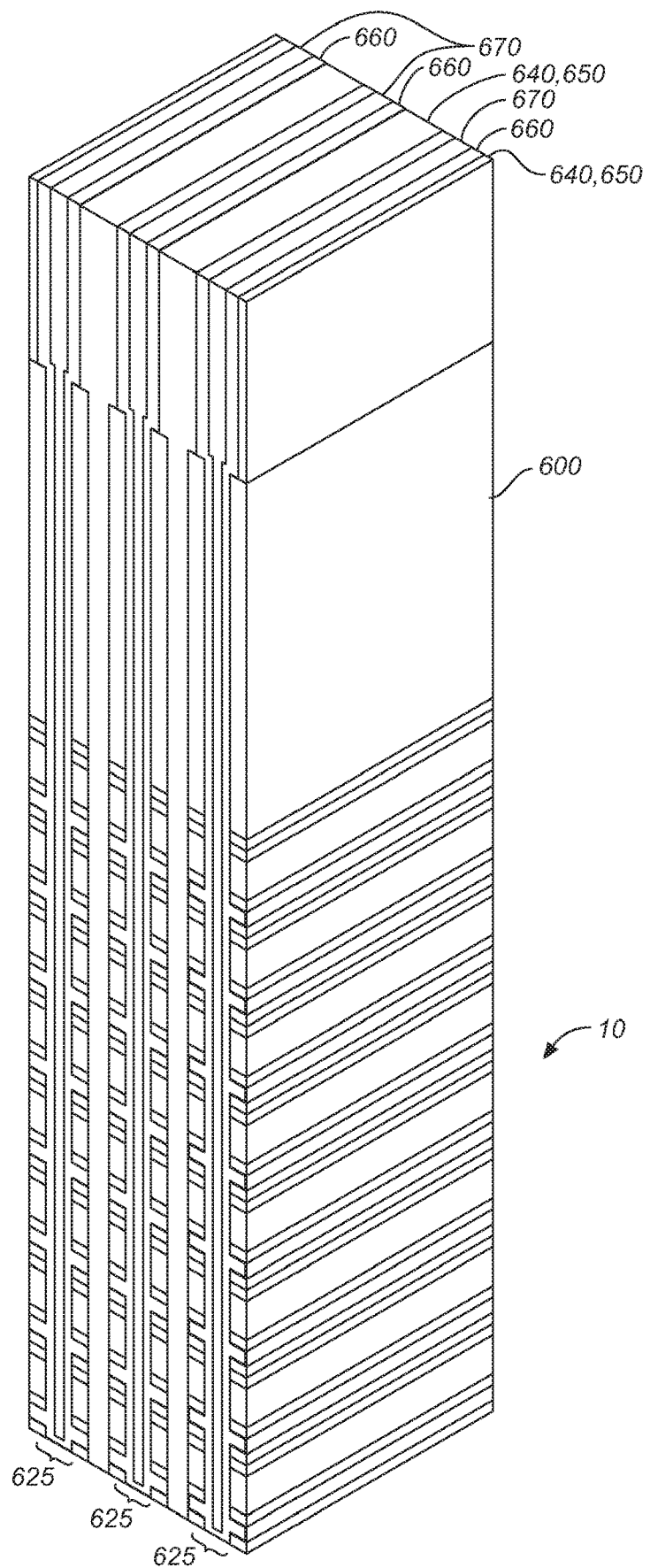
Figure 47:
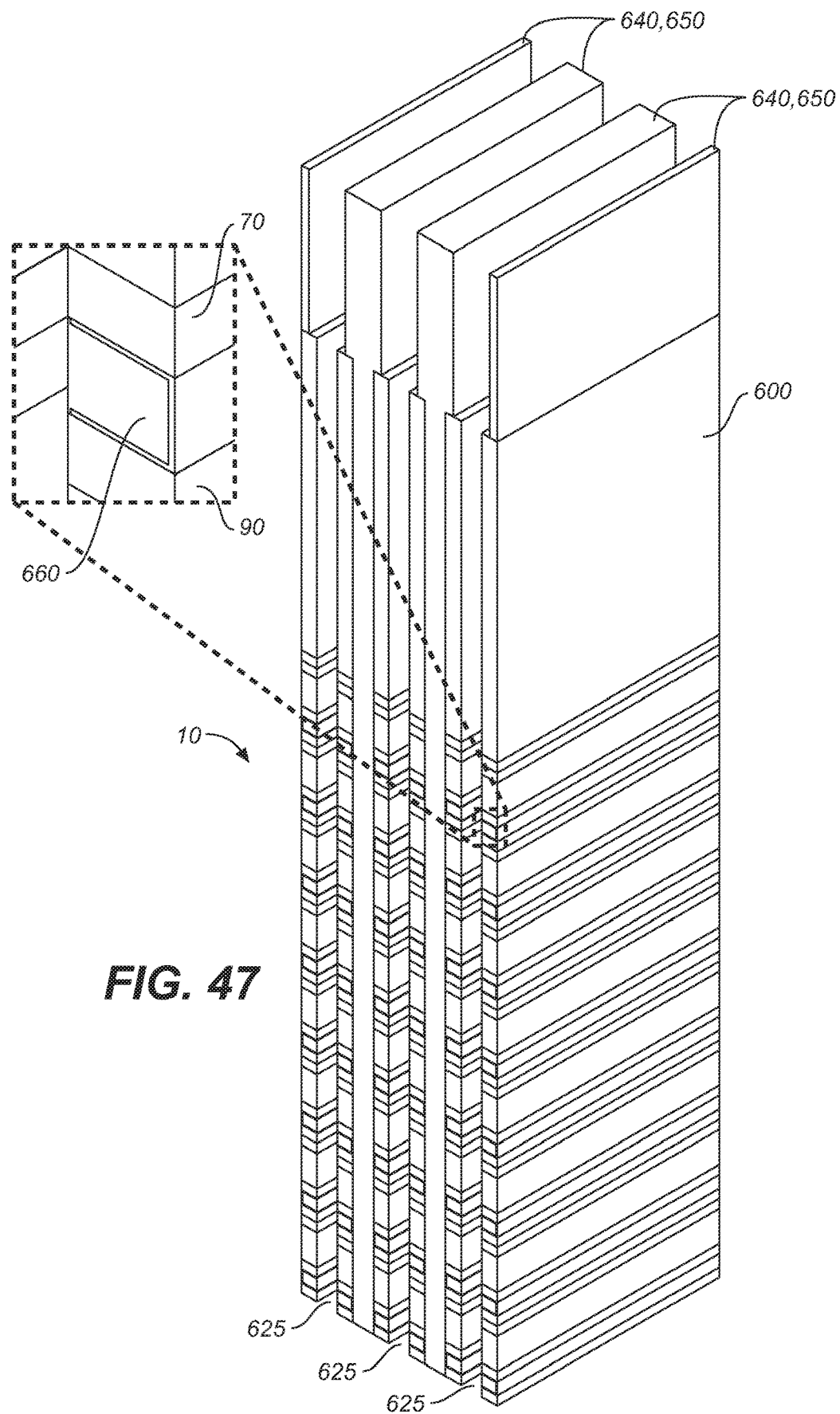

Thereafter, as illustrated in FIG. 43, trenches 620 are filled with dielectric layers 640 and 650, in substantially the same manner as dielectric layers 130 and 140 discussed in conjunction with FIG. 7 above, followed by removal of masking structures 610 of the second masking by etching. FIG. 44 shows that trenches 625 are then etched in memory structure 10. Referring to FIG. 45, SAC4 layer 80 is then removed by selective etching from the exposed surfaces in trenches 625, followed by deposition of metal layer 660, which partially fills trenches 625 and the cavities resulting from removal of SAC4 layer 80 of each active strip, as illustrated in FIG. 46. Referring to FIG. 47, portions of metal layer 660 on the sidewalls of trenches 625 are then removed by a selective anisotropic etch and sideway isotropic etch.

Figure 48:
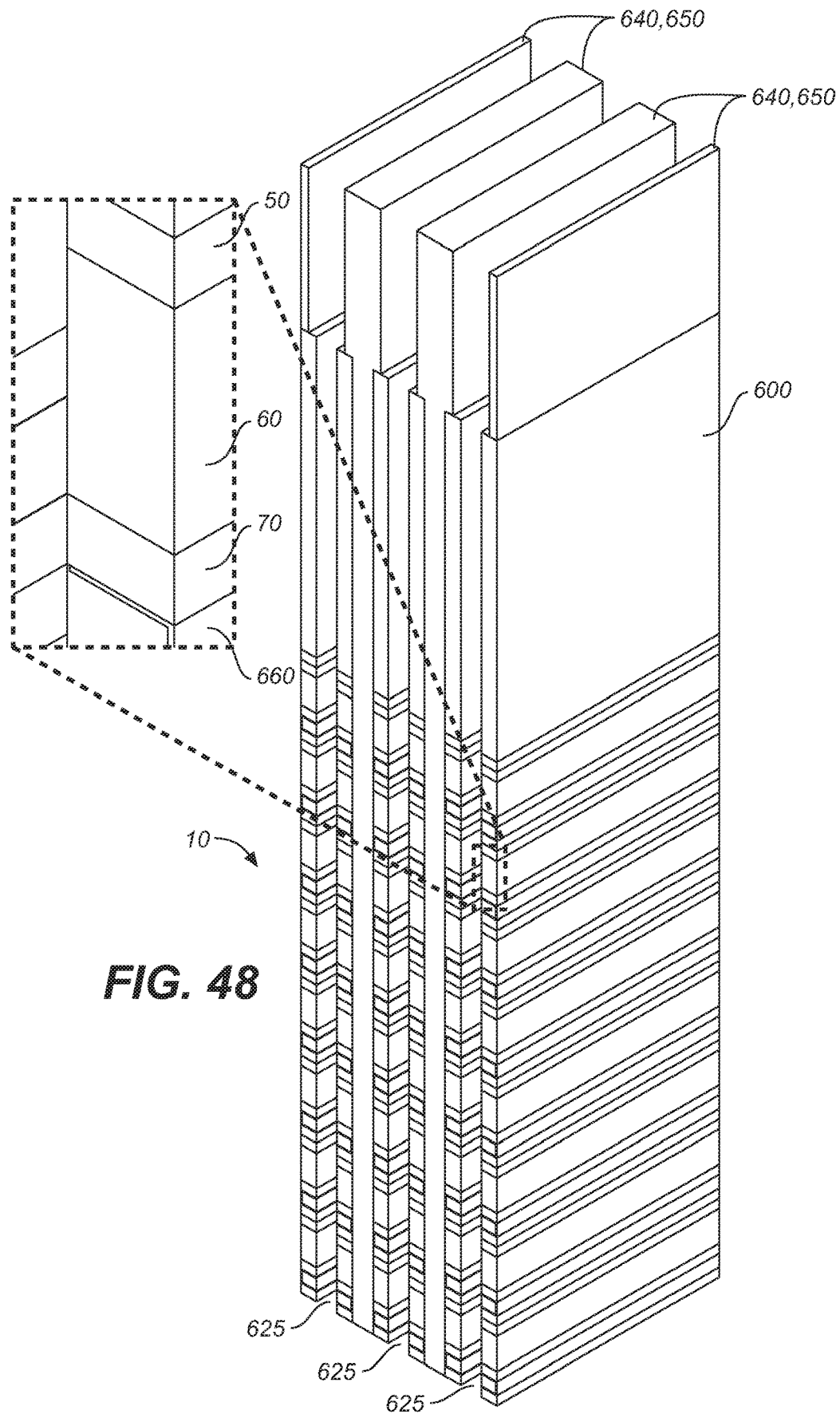
Figure 49:
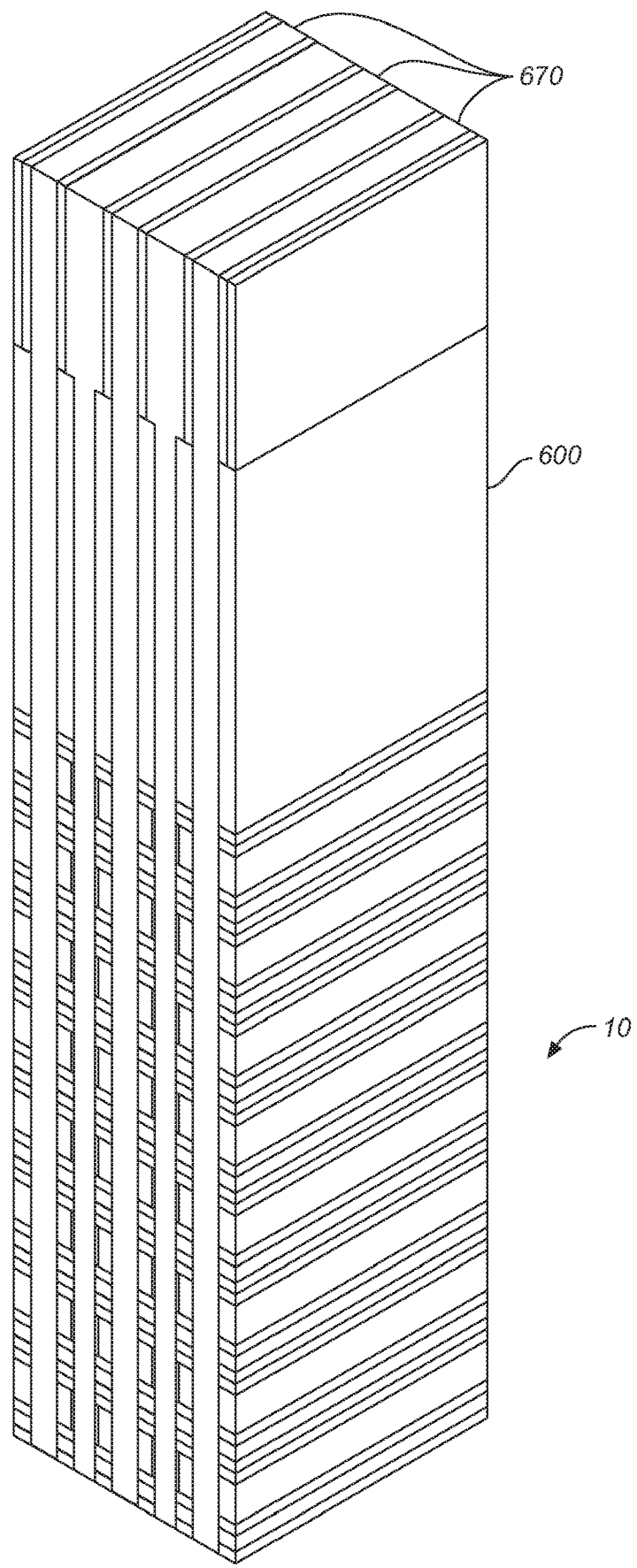
Figure 50:
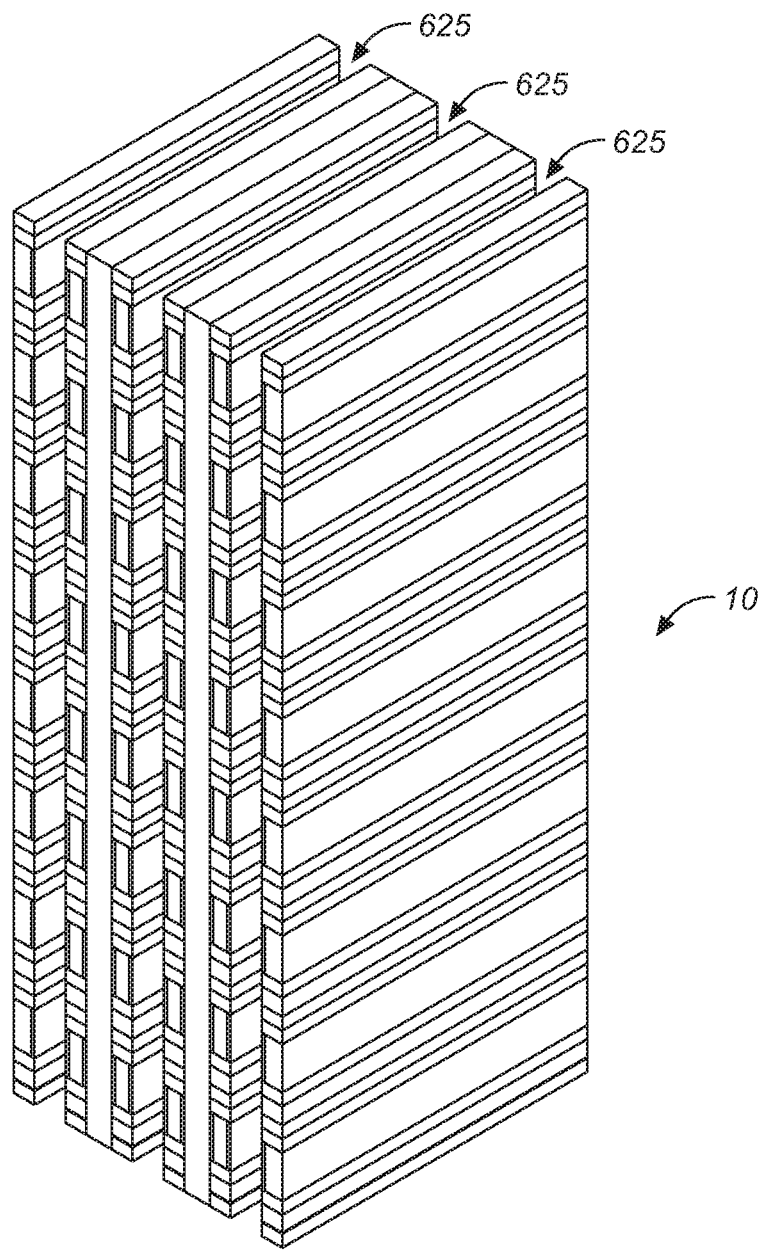

Referring to FIG. 48, portions of SAC1 layer 60 of each active layer exposed in trenches 625 are then recessed by a selective etch. Thereafter, semiconductor layer 670 is deposited, partially filling trenches 625 and the recessed cavities of SAC1 layer 60 of each active layer, as shown in FIG. 49. The portions of dielectric layers 620 and 640 above memory structure 10, together with masking structure 600 of the first masking layer are then removed. Then, portions of semiconductor layer 670 on the sidewalls of trenches 625 are then removed by a selective anisotropic etch, as shown in FIG. 50, and replaced by dielectric layers 640 and 650, in substantially the same manner as discussed above in conjunction with FIG. 45.

The remainder of the fabrication for memory structure 10 may proceed in the same manner as illustrated by FIGS. 17 to 24 above.

As discussed above, methods according to the first embodiment that form the active stacks in two etching steps suffer from lithographic misalignments of up to about ±5 nanometers, which affect the widths of adjacent active stacks. For example, such misalignments may cause alternate active stacks to have different widths (e.g., one active stack may have a width of $L_1+5$ nanometers, while its adjacent active strip may have a width of $L_1-5$ nanometers). Except for highly scaled dimensions, such misalignment can be readily accommodated within the memory chip design. On the other hand, the much wider features in each of the etching steps provide more robust stability without the need for area-consuming support pillars being placed at predetermined intervals, such as those used in conjunction with the methods according to the second embodiment.

In an HNOR memory array according to the present invention, a typical nominal minimum width $L_1$ of an active strip is 50 nanometers, while the nominal minimum width of trench 110 (FIG. 3) separating adjacent active stacks may be 80 nanometers, and the height of an active stack with eight active layers may be approximately 2,000 nanometers (2 microns). The aspect ratio of a stand-alone active stack of 50 nanometer width would therefore be 2000/50, or 40:1, which would be severely challenging to remain standing erect during an etch, let alone through successive process steps which would adversely impact yields and cost. However, using a method according to the first or the third embodiment of the present invention, the width $L_2$ of each masking structure 115 of FIG. 3 is 50+80+50=180 nanometers, therefore the aspect ratio of an etch using masking structures 115 is 2,000/180, or 11:1.

With a method according to the second embodiment, the active stacks are formed in one etch step, thereby avoiding the ±5 nanometers misalignment that may occur between the active stacks. Such a method forms dielectric pillars prior to active stack formation to lend support to and to maintain structural stability in the subsequently formed active stacks. However, the method of the second embodiment may suffer from both ribboning due to the high aspect ratio during the etch step and reduction in the amount of useful memory array area due to the areas occupied by the dielectric pillars.

With a method according to the third embodiment of the present invention, the first mask is required to withstand at least two active stack etching steps that are selective for the first mask relative to the materials used for providing the second and the third masks. Furthermore, the hard mask materials used for providing the first and second masks are required to be compatible with certain dielectric deposition (e.g., LPCVD $SiO_2$). Some hard masks materials (e.g., carbon) are not compatible with $SiO_2$ deposition, which requires oxygen. Such hard mask materials would react with oxygen and be etched by oxygen.

The above detailed description is provided to illustrate specific embodiments of the present invention and is not intended to be limiting. Numerous variations and modifications within the scope of the present invention are possible. The present invention is set forth in the accompanying claims.

We claim:

1. A method for high aspect ratio etching, comprising:
preparing above a surface of a semiconductor substrate a plurality of material multi-layers, stacked one on top of another along a first direction substantially orthogonal to the surface of the semiconductor substrate, wherein each material multi-layer comprises first and second semiconductor layers;
patterning and etching the material multilayers along the first direction using a first mask to form a first set of trenches that divide the material layers into a first group of multi-layer stacks, wherein each of the first set of trenches extends along a second direction substantially parallel to the surface of the semiconductor substrate;
filling the first set of trenches with a dielectric material; and
patterning and etching the first group of multi-layer stacks along the first direction using a second mask to form a second set of trenches that divide the first group of multi-layer stacks into a second group of multi-layer stacks, wherein each of the second set of trenches extends along the second direction parallel the first set of trenches.

2. The method of claim 1, wherein etching the material multi-layer and etching the first group of multi-layers each involve an etch of an aspect ratio less than 40.

3. The method of claim 1, wherein the second mask provides mask structures each overlapping (i) at least two neighboring ones of the first group of multi-layer stacks and (ii) a dielectric material in one of the first set of trenches between the neighboring multi-layer stacks.

4. The method of claim 1, further comprising (i) providing an intermediate mask on the material multi-layers, the intermediate mask providing masking features for defining both the first set of trenches and the second set of trenches, and wherein the first mask is provided on top of the intermediate mask and provides masking structures that protect the second set of trenches during etching the material multi-layers.

5. The method of claim 4, wherein the second mask is formed by the dielectric material filling between masking structures of the first mask.

6. The method of claim 1, further comprising replacing a portion of the dielectric material in each of the first set of trenches with a conductive column that extends along the first direction.

7. The method of claim 6, wherein replacing a portion of the dielectric material in the first set of trenches comprises:
   etching the dielectric material in the first set of trenches to provide a plurality of shafts that extends along the first direction;
   depositing a charge storage material conformally in each shaft; and
   filling each shaft with a conductive material to form the conductive columns.

8. The method of claim 6, further comprising, prior to preparing the material multi-layers, providing a plurality of conductors above the surface of the semiconductor substrate, each conductor extending along a third direction substantially orthogonal to each of the first and second directions.

9. The method of claim 8, further comprising providing a conductive path to enable each conductive column to be electrically connected to one of the conductors.

10. The method of claim 6, further comprising providing a plurality of conductors above the second group of multi-layer stacks, each conductor extending along a third direction substantially orthogonal to each of the first and second directions.

11. The method of claim 10, further comprising providing conductive paths to enable each conductive column to be electrically connected to one of the conductors.

12. The method of claim 10, further comprising:
   providing circuit elements in the semiconductor substrate; and
   electrically connecting selected ones of the conductive columns to corresponding ones of the circuit elements, each of the selected conductive columns being situated substantially above its corresponding circuit element.

13. The method of claim 12, further comprising providing an isolation layer between the circuit elements and the conductive columns, wherein electrically connecting selected ones of the conductive columns to their corresponding circuit elements comprises creating conductive paths through the isolation layer.

14. The method of claim 1, further comprising creating a stair case structure at one or more ends of each multi-layer stack in the second group of multilayer stacks, wherein each staircase structure has steps that successively extends the layers of the multi-layer stack along the second direction, and wherein each step exposes the first semiconductor layer or the second semiconductor layer, or another conductive layer, of a multi-layer in the multi-layer stack.

15. The method of claim 14, further comprising providing an electrically insulating material over the staircase structure and providing via connections along the first direction to electrically connect to the exposed semiconductor layer, or the conductive layer, of a step of the staircase structures.

16. The method of claim 1, wherein each material multi-layer further comprises a sacrificial layer between the first and second semiconductor layers, the method further comprising replacing a portion of the sacrificial layer by a third semiconductor layer.

17. The method of claim 1, wherein each material multi-layer further comprises a sacrificial layer adjacent one or both of the first semiconductor layer and the second semiconductor layer, the method further comprising replacing at least a portion of the sacrificial layer by a conductive material.

* * * * *